United States Patent
Shimizu

(10) Patent No.: US 10,281,497 B2
(45) Date of Patent: May 7, 2019

(54) CURRENT SENSOR INCLUDING A FIRST FLOW PORTION AND A SECOND FLOW PORTION

(71) Applicant: Murata Manufacturing Co., Ltd., Nagaokakyo-shi, Kyoto-fu (JP)

(72) Inventor: Yasuhiro Shimizu, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/726,492

(22) Filed: Oct. 6, 2017

(65) Prior Publication Data

US 2018/0038898 A1 Feb. 8, 2018

Related U.S. Application Data

(63) Continuation of application No. PCT/JP2016/067879, filed on Jun. 16, 2016.

(30) Foreign Application Priority Data

Jul. 10, 2015 (JP) .................................. 2015-138530

(51) Int. Cl.
*G01R 15/20* (2006.01)
*G01R 33/07* (2006.01)
(Continued)

(52) U.S. Cl.
CPC ........... *G01R 15/20* (2013.01); *G01R 15/207* (2013.01); *G01R 33/07* (2013.01); *G01R 33/09* (2013.01);
(Continued)

(58) Field of Classification Search
CPC combination set(s) only.
See application file for complete search history.

(56) References Cited

U.S. PATENT DOCUMENTS 6,515,468 B1 * 2/2003 Morimoto ............ G01R 15/207
324/117 H
2005/0185346 A1 8/2005 Shoji

FOREIGN PATENT DOCUMENTS

JP 2002-107386 A 4/2002
JP 2005-236134 A 9/2005
(Continued)

OTHER PUBLICATIONS

Official Communication issued in International Patent Application No. PCT/JP2016/067879, dated Aug. 30, 2016.

*Primary Examiner* — Jay Patidar
(74) *Attorney, Agent, or Firm* — Keating & Bennett, LLP

(57) ABSTRACT

A current sensor includes a conductor through which a current to be measured flows, and first and second magnetic sensor elements that detect an intensity of a magnetic field generated by the current. The conductor includes first and second flow portions through which the current flows after the current is shunted. The first and second magnetic sensor elements are provided between the first and second flow portions in a thickness direction of the conductor. At least a portion of each of the first and second magnetic sensor elements is provided between the first and second flow portions in a width direction of the conductor. In the width direction of the conductor, a distance between a center portion of the first magnetic sensor element and a center portion of the second magnetic sensor element is less than or equal to a distance between the first flow portion and the second flow portion.

28 Claims, 19 Drawing Sheets

(51) Int. Cl.
   *G01R 33/09* (2006.01)
   *H01L 43/08* (2006.01)
   *G01R 19/00* (2006.01)

(52) U.S. Cl.
   CPC .......... *H01L 43/08* (2013.01); *G01R 19/0092* (2013.01); *H01L 2224/48091* (2013.01)

(56) References Cited

FOREIGN PATENT DOCUMENTS

| | | |
   |---|---|---|
   | JP | 2007-078418 A | 3/2007 |
   | JP | 2008-039734 A | 2/2008 |
   | JP | 2013-088370 A | 5/2013 |
   | JP | 2014-010075 A | 1/2014 |

\* cited by examiner

DISTANCE FROM STARTING
POINT IN X-AXIS DIRECTION [mm]

CURRENT SENSOR INCLUDING A FIRST FLOW PORTION AND A SECOND FLOW PORTION

CROSS REFERENCE TO RELATED APPLICATIONS

This application claims the benefit of priority to Japanese Patent Application No. 2015-138530 filed on Jul. 10, 2015 and is a Continuation Application of PCT Application No. PCT/JP2016/067879 filed on Jun. 16, 2016. The entire contents of each application are hereby incorporated herein by reference.

BACKGROUND OF THE INVENTION

1. Field of the Invention

The present invention relates to a current sensor, and to a current sensor that detects a value of a measured current to be measured by measuring a magnetic field generated according to the measured current.

2. Description of the Related Art

Japanese Unexamined Patent Application Publication No. 2007-78418 and Japanese Unexamined Patent Application Publication No. 2014-10075 disclose the structures of current sensors.

In a current sensor described in Japanese Unexamined Patent Application Publication No. 2007-78418, an integrated chip is disposed between two parallel lines defined by busbars. The integrated chip is disposed in a level-difference space provided between the two lines so that one of the lines is located on the front side and the other line is located on the back side. Magnetic vectors in opposite directions generated by currents flowing through the lines (currents in the same direction in both the lines) are separately detected by magnetic detection elements mounted on the integrated chip.

A current sensor described in Japanese Unexamined Patent Application Publication No. 2014-10075 includes a case in which a conductor can be disposed between a pair of arm portions, and a plurality of electromagnetic conversion elements opposed to each other with the arrangement position of the conductor interposed therebetween inside the case and having sensitivity axes in a direction perpendicular or substantially perpendicular to the flowing direction of a measured current flowing through the conductor. The case is attached with different edge portions in the thickness direction of the pair of arm portions in contact with the conductor, and is inclined to one side relative to the conductor in the directions of the sensitivity axes of the electromagnetic conversion elements defining and functioning as an axial direction thereof.

In the current sensor described in Japanese Unexamined Patent Application Publication No. 2007-78418, the distance between the magnetic detection elements in the width direction of the lines is longer than the distance between the lines. When the distance between the magnetic detection elements is longer than the distance between the lines, a measurement error of the current sensor resulting from displacement of the integrated chip in the width direction of the lines is large.

In the current sensor described in Japanese Unexamined Patent Application Publication No. 2014-10075, the conductor is located between the two electromagnetic conversion elements. It is therefore difficult to integrate the two electromagnetic conversion elements in one chip, and this hinders size reduction of the current sensor.

SUMMARY OF THE INVENTION

Preferred embodiments of the present invention provide current sensors that reduce or prevent measurement errors resulting from displacement of electromagnetic sensor elements relative to a conductor through which a current to be measured flows.

A current sensor according to a preferred embodiment of the present invention includes a plate-shaped conductor through which a current to be measured flows, the conductor including a front surface and a back surface and having a length direction, a width direction perpendicular or substantially perpendicular to the length direction, and a thickness direction perpendicular or substantially perpendicular to the length direction and the width direction, and a first magnetic sensor element and a second magnetic sensor element that detect an intensity of a magnetic field generated by the current. The conductor includes a first flow portion and a second flow portion through which the current flows after the current is shunted midway in the length direction. The first flow portion and the second flow portion are located with a space therebetween in the width direction and the thickness direction. The first magnetic sensor element and the second magnetic sensor element are provided between the first flow portion and the second flow portion in the thickness direction. At least a portion of each of the first magnetic sensor element and the second magnetic sensor element is provided between the first flow portion and the second flow portion in the width direction. In the width direction, a distance between a center portion of the first magnetic sensor element and a center portion of the second magnetic sensor element is less than or equal to a distance between the first flow portion and the second flow portion.

In a preferred embodiment of the present invention, the first magnetic sensor element and the second magnetic sensor element extend in the width direction.

In a preferred embodiment of the present invention, each of the center portion of the first magnetic sensor element and the center portion of the second magnetic sensor element is located between the first flow portion and the second flow portion in the width direction.

In a preferred embodiment of the present invention, each of the first magnetic sensor element and the second magnetic sensor element is entirely located between the first flow portion and the second flow portion in the width direction.

In a preferred embodiment of the present invention, a portion of the first magnetic sensor element overlaps with a portion of the conductor that defines the first flow portion, when viewed from the thickness direction. A portion of the second magnetic sensor element overlaps with a portion of the conductor that defines the second flow portion, when viewed from the thickness direction.

In a preferred embodiment of the present invention, the conductor includes an arch-shaped portion bending and projecting toward one side in the thickness direction and extending in the length direction to define the first flow portion.

In a preferred embodiment of the present invention, the conductor further includes an inverse-arch-shaped portion bending and projecting toward the other side in the thickness direction and extending in the length direction to define the second flow portion.

In a preferred embodiment of the present invention, a portion of the first magnetic sensor element is disposed inside the arch-shaped portion to be located on a side of the back surface of the conductor. A portion of the second magnetic sensor element is disposed inside the inverse-arch-shaped portion to be located on a side of the front surface of the conductor.

In a preferred embodiment of the present invention, the arch-shaped portion and the inverse-arch-shaped portion have the same shape or substantially the same shape.

In a preferred embodiment of the present invention, the first flow portion bulges out toward the front surface of the conductor, when viewed from the width direction.

In a preferred embodiment of the present invention, the second flow portion bulges out toward the back surface of the conductor, when viewed from the width direction.

In a preferred embodiment of the present invention, each of the first flow portion and the second flow portion includes first and second ends extending in the length direction. The first end of the first flow portion and the second end of the first flow portion in the length direction are located at different positions in the thickness direction. The first end of the second flow portion and the second end of the second flow portion in the length direction are located at different positions in the thickness direction. The first end of the first flow portion and the first end of the second flow portion in the length direction are located at the same position in the thickness direction. The second end of the first flow portion and the second end of the second flow portion in the length direction are located at the same position in the thickness direction. The first flow portion includes a bent portion that connects a position of the first end of the first flow portion and a position of the second end of the first flow portion in the thickness direction. The second flow portion includes a bent portion that connects a position of the first end of the second flow portion and a position of the second end of the second flow portion in the thickness direction. The bent portion of the first flow portion and the bent portion of the second flow portion are located with a space therebetween in the length direction.

In a preferred embodiment of the present invention, shapes of the first flow portion and the second flow portion are point-symmetrical with respect to each other.

In a preferred embodiment of the present invention, the conductor includes a slit extending in the length direction so that the first flow portion and the second flow portion are located with a space therebetween in the width direction.

In a preferred embodiment of the present invention, the slit is located in a center portion of the conductor in the width direction.

In a preferred embodiment of the present invention, a center portion of the slit is located in a middle portion between the first magnetic sensor element and the second magnetic sensor element in the width direction, when viewed from the thickness direction.

In a preferred embodiment of the present invention, the conductor is defined by a single conductor.

In a preferred embodiment of the present invention, each of the first magnetic sensor element and the second magnetic sensor element is located in a middle portion between the first flow portion and the second flow portion in the thickness direction.

In a preferred embodiment of the present invention, the first magnetic sensor element and the second magnetic sensor element are arranged in the thickness direction.

In a preferred embodiment of the present invention, each of the first magnetic sensor element and the second magnetic sensor element detects a magnetic field component in the width direction. The first magnetic sensor element is disposed at a position where a magnetic field component of the magnetic field directed toward one side in the width direction is applied. The second magnetic sensor element is disposed at a position where a magnetic field component of the magnetic field directed toward the other side in the width direction is applied.

In a preferred embodiment of the present invention, the first magnetic sensor element and the second magnetic sensor element are mounted on a single substrate.

In a preferred embodiment of the present invention, the first magnetic sensor element and the second magnetic sensor element are mounted on different substrates.

In a preferred embodiment of the present invention, the current sensor further includes a housing that stores the first magnetic sensor element and the second magnetic sensor element. The housing is in contact with at least a portion of a back surface of the first flow portion.

In a preferred embodiment of the present invention, the first flow portion includes an extending portion extending in the length direction. The housing is in contact with at least a portion of a back surface of the extending portion.

In a preferred embodiment of the present invention, the current sensor further includes a housing that stores the first magnetic sensor element and the second magnetic sensor element. The housing is in contact with at least a portion of a back surface of the first flow portion and at least a portion of a front surface of the second flow portion.

In a preferred embodiment of the present invention, each of the first flow portion and the second flow portion includes an extending portion extending in the length direction. The housing is in contact with at least a portion of a back surface of the extending portion of the first flow portion and at least a portion of a front surface of the extending portion of the second flow portion.

In a preferred embodiment of the present invention, the current sensor further includes a calculator that calculates a value of the current by computing a detection value of the first magnetic sensor element and a detection value of the second magnetic sensor element. A phase of the detection value of the first magnetic sensor element and a phase of the detection value of the second magnetic sensor element for the intensity of the magnetic field generated by the current flowing through the conductor are opposite from each other. The calculator is a subtractor or a differential amplifier, for example.

In a preferred embodiment of the present invention, the current sensor further includes a calculator that calculates a value of the current by computing a detection value of the first magnetic sensor element and a detection value of the second magnetic sensor element. A phase of the detection value of the first magnetic sensor element and a phase of the detection value of the second magnetic sensor element for the magnetic field are the same. The calculator is an adder or a summing amplifier, for example.

According to preferred embodiments of the present invention, the size of current sensors is reduced while reducing or eliminating measurement errors resulting from displacement of the magnetic sensor elements relative to the conductor through which the current to be measured flows.

DETAILED DESCRIPTION OF THE PREFERRED EMBODIMENTS

Figure 1:
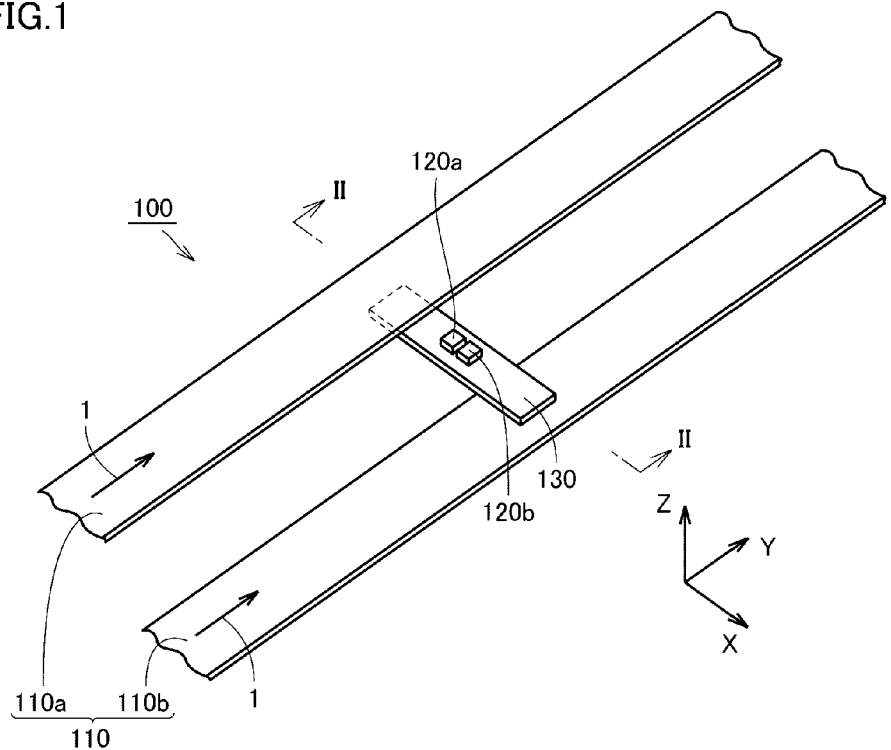
FIG. 1 is a perspective view illustrating an outward appearance of a current sensor according to a first preferred embodiment of the present invention.

Current sensors according to preferred embodiments of the present invention will be described below with reference to the drawings. In the following descriptions of the preferred embodiments, the same or corresponding components in the drawings are denoted by the same signs, and descriptions thereof are not repeated.

First Preferred Embodiment

Figure 2:
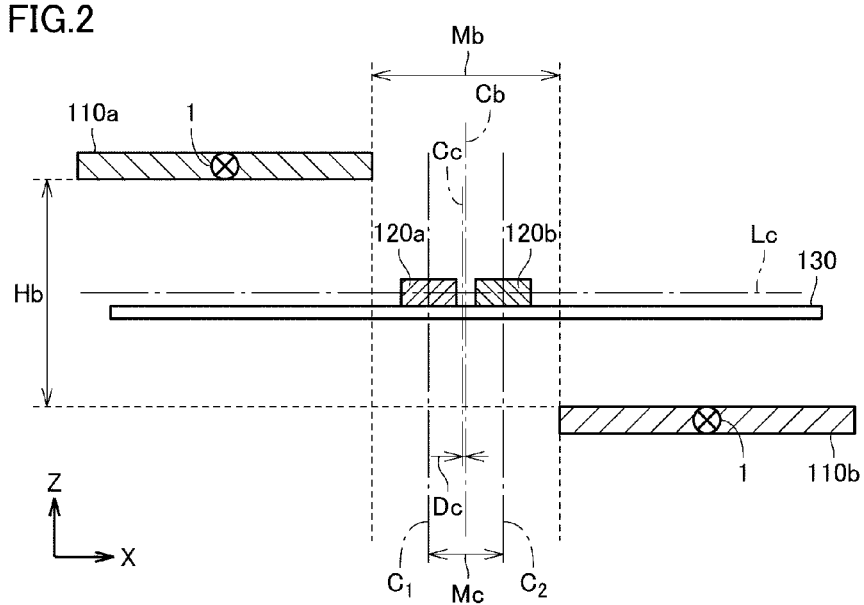
FIG. 2 is a cross-sectional view of the current sensor according to the first preferred embodiment of the present invention, when viewed from a direction of arrow II-II in FIG. 1.
Figure 3:
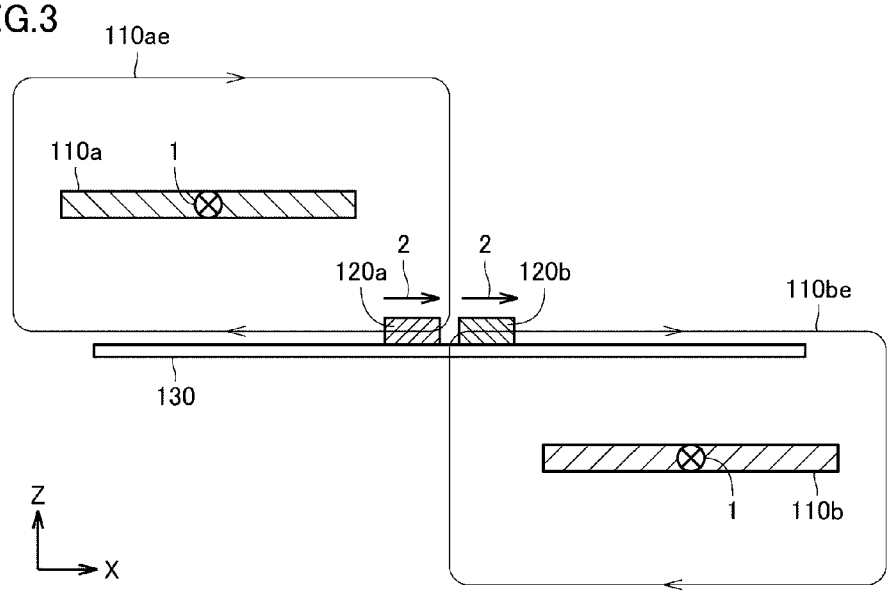
FIG. 3 is a cross-sectional view schematically illustrating a magnetic field generated when a current to be measured flows through a primary conductor in the current sensor according to the first preferred embodiment of the present invention.
Figure 4:
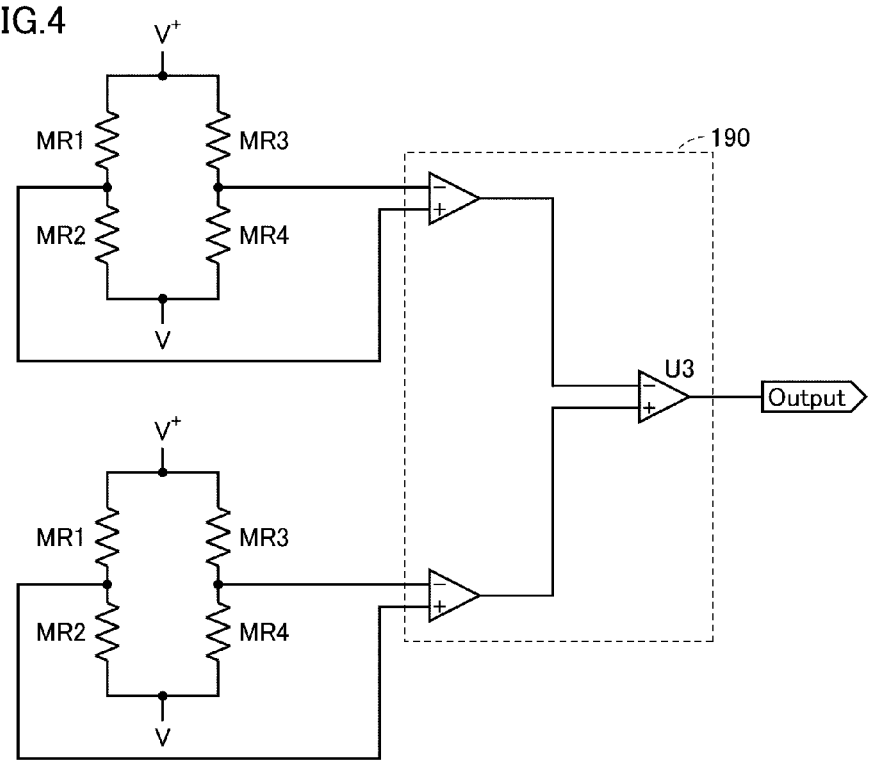
FIG. 4 is a circuit diagram illustrating a circuit configuration of the current sensor according to the first preferred embodiment of the present invention.

FIG. 1 is a perspective view illustrating an outward appearance of a current sensor according to a first preferred embodiment of the present invention. FIG. 2 is a cross-sectional view of the current sensor according to the first preferred embodiment of the present invention, when viewed from a direction of arrow II-II in FIG. 1. FIG. 3 is a cross-sectional view schematically illustrating a magnetic field generated when a current to be measured flows through a primary conductor in the current sensor according to the first preferred embodiment of the present invention. FIG. 4 is a circuit diagram illustrating a circuit configuration of the current sensor according to the first preferred embodiment of the present invention. In FIGS. 1 to 3, the width direction of a primary conductor 110 to be described later is shown as an X-axis direction, the length direction of the primary conductor 110 is shown as a Y-axis direction, and the thickness direction of the primary conductor 110 is shown as a Z-axis direction. FIG. 3 shows the same cross section as that of FIG. 2.

As illustrated in FIGS. 1 to 4, a current sensor 100 according to the first preferred embodiment of the present invention includes a primary conductor 110 defining and functioning as a conductor through which a measured current to be measured flows, and a first magnetic sensor element 120a and a second magnetic sensor element 120b that detect the intensity of a magnetic field generated by the measured current flowing through the primary conductor 110. Specifically, the primary conductor 110 is shaped like a plate including a front surface and a back surface and having a length direction (Y-axis direction), a width direction (X-direction) perpendicular or substantially perpendicular to the length direction (Y-axis direction), and a thickness direction (Z-axis direction) perpendicular or substantially perpendicular to the length direction (Y-axis direction) and the width direction (X-axis direction).

The current to be measured is shunted into two flow passages and flows through the primary conductor 110 in the length direction (Y-axis direction) of the primary conductor 110, as shown by arrows 1. The primary conductor 110 includes a first flow portion and a second flow portion through which the current to be measured flows after shunted midway in the length direction (Y-axis direction). The first flow portion defining and functioning as one of the two flow passages and the second flow portion defining and functioning as the other flow passage are arranged with a space therebetween in the width direction (X-axis direction) of the primary conductor 110 and the thickness direction (Z-axis direction) of the primary conductor 110.

In this preferred embodiment, the primary conductor 110 includes two conductors that are electrically coupled at both ends. A first conductor 110a of the two conductors defines the first flow portion, and a second conductor 110b of the two conductors defines the second flow portion. The first conductor 110a and the second conductor 110b each have a flat plate shape. The first conductor 110a and the second conductor 110b extend parallel or substantially parallel to each other, and are connected at both ends by unillustrated connecting wires.

The primary conductor 110 is made of copper. However, the material of the primary conductor 110 is not limited to copper, and may be metal such as silver, aluminum, or iron, or an alloy containing these metals.

The primary conductor 110 may be surface-treated. For example, at least one plated layer made of metal, such as nickel, tin, silver, or copper, or an alloy containing these metals may be provided on a surface of the primary conductor 110.

In this preferred embodiment, the primary conductor 110 is preferably formed by press working, for example. However, the forming method for the primary conductor 110 is not limited thereto, and the primary conductor 110 may be formed by, for example, cutting or casting.

The first magnetic sensor element 120a and the second magnetic sensor element 120b are provided between the first flow portion and the second flow portion in the thickness direction (Z-axis direction) of the primary conductor 110, and are arranged side by side in the width direction (X-axis direction) of the primary conductor 110.

In this preferred embodiment, the first magnetic sensor element 120a and the second magnetic sensor element 120b are mounted on a single substrate 130. The first magnetic sensor element 120a and the second magnetic sensor element 120b are mounted on the substrate 130 together with electronic components such as an amplifier and a passive element. In FIGS. 1 to 3, the amplifier and the passive element are not illustrated. However, the amplifier and the passive element may be mounted on a substrate different from the substrate 130 on which the first magnetic sensor element 120a and the second magnetic sensor element 120b are mounted.

The substrate 130 is a printed wiring board, and includes a base material, such as glass epoxy or alumina, and a wire formed by patterning a metal foil made of copper or the like and provided on a surface of the base material.

The substrate 130 on which the first magnetic sensor element 120a and the second magnetic sensor element 120b are mounted is inserted between the first conductor 110a and the second conductor 110b. While the substrate 130 is located at a distance extending from and parallel or substantially parallel to each of the first conductor 110a and the second conductor 110b in this preferred embodiment, the substrate 130 may be perpendicular or substantially perpendicular to each of the first conductor 110a and the second conductor 110b.

In FIG. 2, a center line passing through the centers of the first magnetic sensor element 120a and the second magnetic sensor element 120b in the width direction (X-axis direction) of the primary conductor 110 is represented by Lc. In the thickness direction (Z-axis direction) of the primary conductor 110, a center line passing through the center of the first magnetic sensor element 120a is represented by $C_1$, a center line passing through the center of the second magnetic sensor element 120b is represented by $C_2$, and a center line between the center line $C_1$ and the center line $C_2$ is represented by Cc. A distance between the center line $C_1$ and the center line $C_2$ (sensor distance) is represented by Mc.

The centers of the first magnetic sensor element 120a and the second magnetic sensor element 120b are the centers of regions defining magneto resistance elements (to be described later) provided in the first magnetic sensor element 120a and the second magnetic sensor element 120b. For example, when the first magnetic sensor element 120a includes four AMR elements, the center of the first magnetic sensor element 120a is the center of a region including the four AMR elements, and the center line $C_1$ passes through a middle point between a position closest to one side and a position closest to the other side of the region, which includes the four AMR elements, in the width direction (X-axis direction) of the primary conductor 110.

In the width direction (X-axis direction) of the primary conductor 110, a center line passing through a middle portion between the first conductor 110a and the second conductor 110b is represented by Cb, and a distance between the first conductor 110a and the second conductor 110b (width of a horizontal gap of the primary conductor 110) is represented by Mb. A distance (displacement amount) between the center line Cb and the center line Cc is represented by Dc. In the thickness direction (Z-axis direction) of the primary conductor 110, a distance between the first conductor 110a and the second conductor 110b (width of a vertical gap of the primary conductor 110) is represented by Hb. In this preferred embodiment, the center line Lc passes through almost the middle portion between the first conductor 110a and the second conductor 110b.

In the width direction (X-axis direction) of the primary conductor 110, the distance Mc between the center of the first magnetic sensor element 120a and the center of the second magnetic sensor element 120b is less than or equal to the distance Mb between the first conductor 110a and the second conductor 110b.

In this preferred embodiment, the center of the first magnetic sensor element 120a and the center of the second magnetic sensor element 120b are each located between the first conductor 110a and the second conductor 110b in the width direction (X-axis direction) of the primary conductor 110.

Further, the first magnetic sensor element 120a and the second magnetic sensor element 120b are each entirely located between the first conductor 110a and the second conductor 110b in the width direction (X-axis direction) of the primary conductor 110. For example, when the first magnetic sensor element 120a includes four AMR elements, the region including the four AMR elements is entirely located between the first conductor 110a and the second conductor 110b.

The first magnetic sensor element 120a and the second magnetic sensor element 120b each detect a magnetic field in the width direction (X-axis direction) of the primary conductor 110. Specifically, as illustrated in FIG. 3, each of the first magnetic sensor element 120a and the second magnetic sensor element 120b has a detection axis 2 pointing in the width direction (X-axis direction) of the primary conductor 110.

Each of the first magnetic sensor element 120a and the second magnetic sensor element 120b has such odd-function input/output characteristics to output a positive value when detecting a magnetic field directed in one direction of the detection axis 2 and to output a negative value when detecting a magnetic field directed in a direction opposite from the one direction of the detection axis 2.

As illustrated in FIG. 4, in the current sensor 100 of this preferred embodiment, each of the first magnetic sensor element 120a and the second magnetic sensor element 120b includes a Wheatstone bridge circuit including four AMR (Anisotropic Magneto Resistance) elements. Instead of the AMR elements, each of the first magnetic sensor element 120a and the second magnetic sensor element 120b may include magneto resistance elements such as GMR (Giant Magneto Resistance) elements, TMR (Tunnel Magneto Resistance) elements, BMR (Ballistic Magneto Resistance) elements, or CMR (Colossal Magneto Resistance) elements.

Each of the first magnetic sensor element 120a and the second magnetic sensor element 120b may include a half-bridge circuit including two magneto resistance elements. Alternatively, each of the first magnetic sensor element 120a and the second magnetic sensor element 120b may be a magnetic sensor element including Hall elements, a magnetic sensor element including MI (Magneto Impedance) elements using the magnetic impedance effect, or a fluxgate magnetic sensor element. The magnetic elements, such as magneto resistance elements and Hall elements, may be resin-packaged or may be potted in, for example, silicone resin or epoxy resin.

When a plurality of magnetic elements are packaged, they may be packaged in one or may be separately packaged. Alternatively, a plurality of magnetic elements may be packaged in one in a state in which the magnetic elements and electronic components are integrated.

In this preferred embodiment, the AMR elements include odd-function input/output characteristic by including barber-pole type electrodes. Specifically, the magneto resistance elements in the first magnetic sensor element 120a and the second magnetic sensor element 120b are biased by including barber-pole type electrodes so that the current flows in a direction at a predetermined angle to the magnetization direction of magneto resistance films in the magneto resistance elements.

The magnetization direction of the magneto resistance films is determined by shape anisotropy of the magneto resistance films. The method for adjusting the magnetization direction of the magneto resistance films is not limited to the method using the shape anisotropy of the magneto resistance films, and, for example, a method of disposing a permanent magnet near the magneto resistance films that define the AMR elements or a method of providing exchange coupling in the magneto resistance films that define the AMR elements may be used. The permanent magnet may be defined by a sintered magnet, a bonded magnet, or a thin film. The kind of the permanent magnet is not particularly limited, and for example, a ferrite magnet, a samarium-cobalt magnet, an Al—Ni—Co magnet, or a neodymium magnet can be used.

The magnetization direction of the magneto resistance films in the magneto resistance elements of the first magnetic sensor element 120a is the same as the magnetization direction of the magneto resistance films in the magneto resistance elements of the second magnetic sensor element 120b. This significantly reduces or prevents deterioration of the output accuracy due to the influence of an external magnetic field.

As illustrated in FIG. 4, the current sensor 100 further includes a calculator 190 that calculates the value of a measured current flowing through the primary conductor 110 by computing the detection value of the first magnetic sensor element 120a and the detection value of the second magnetic sensor element 120b. In this preferred embodiment, the calculator 190 is a differential amplifier, for example. However, the calculator 190 may be a subtractor, for example.

As illustrated in FIG. 3, the measured current flowing through the primary conductor 110 separately flows through two flow passages, that is, the first flow portion passing through the first conductor 110a and the second flow portion passing through the second conductor 110b. Since the current separately flows through the two flow passages in the primary conductor 110, a magnetic field 110ae passing around the first conductor 110a and a magnetic field 110be passing around the second conductor 110b are generated by the so-called Ampere's circuital law.

When the measured current flows through the primary conductor 110, a measured magnetic field to be measured, defining and functioning as a combination of the magnetic field 110ae and the magnetic field 110be, acts on each of the first magnetic sensor element 120a and the second magnetic sensor element 120b.

The first magnetic sensor element 120a is disposed at a position where a magnetic field component of the measured magnetic field directed toward one side in the width direction (X-axis direction) of the primary conductor 110 is applied. Specifically, the first magnetic sensor element 120a is disposed at a position where a magnetic field component directed in a direction opposite from the arrow direction of the detection axis 2 is applied.

The second magnetic sensor element 120b is disposed at a position where a magnetic field component of the measured magnetic field directed toward the other side in the width direction (X-axis direction) of the primary conductor 110 is applied. Specifically, the second magnetic sensor element 120b is disposed at a position where a magnetic field component directed in the arrow direction of the detection axis 2 is applied.

That is, since the direction of the magnetic flux in the width direction (X-axis direction) of the primary conductor 110 acting on the first magnetic sensor element 120a is opposite from the direction of the magnetic flux in the width direction (X-axis direction) of the primary conductor 110 acting on the second magnetic sensor element 120b, the phase of the detection value of the first magnetic sensor element 120a and the phase of the detection value of the second magnetic sensor element 120b for the intensity of the measured magnetic field generated by the measured current flowing through the primary conductor 110 are opposite from each other. Hence, when the intensity of the measured magnetic field detected by the first magnetic sensor element 120a has a negative value, the intensity of the measured magnetic field detected by the second magnetic sensor element 120b has a positive value.

The detection value of the first magnetic sensor element 120a and the detection value of the second magnetic sensor element 120b are computed by the calculator 190. Specifically, the calculator 190 subtracts the detection value of the first magnetic sensor element 120a from the detection value of the second magnetic sensor element 120b. From this result, the value of the measured current flowing through the primary conductor 110 is calculated.

In the current sensor 100 according to this preferred embodiment, since the distance between the first magnetic sensor element 120a and the second magnetic sensor element 120b is short, an external magnetic-field source cannot be physically located between the first magnetic sensor element 120a and the second magnetic sensor element 120b.

For this reason, the direction of the magnetic field component in the direction of the detection axis 2 in the magnetic field applied from the external magnetic-field source to the first magnetic sensor element 120a is the same as the direction of the magnetic field component in the direction of the detection axis 2 in the magnetic field applied from the external magnetic-field source to the second magnetic sensor element 120b. Hence, when the intensity of the external magnetic field detected by the first magnetic sensor element 120a has a positive value, the intensity of the external magnetic field detected by the second magnetic sensor element 120b also has a positive value.

As a result, when the calculator 190 subtracts the detection value of the first magnetic sensor element 120a from the detection value of the second magnetic sensor element 120b, the magnetic field from the external magnetic-field source is hardly detected. That is, the influence of the external magnetic field is reduced.

A description will now be given of the result of simulation analysis that verifies the influence of the relationship between the distance Mb and the distance Mc on the measurement accuracy of the current sensor 100.

As conditions of the simulation analysis, the width and thickness of each of the first conductor 110a and the second conductor 110b were set at about 5.5 mm and about 1.5 mm, respectively, Mb was set at about 6.0 mm, and Hb was set at about 7.0 mm. A current of about 300 A was passed through each of the first conductor 110a and the second conductor 110b. Under these conditions, simulation analysis was conducted on the magnetic flux density distribution of the measured magnetic field on the center line Lc. In the width direction (X-axis direction) of the primary conductor 110, a starting point of the center line Lc is at a position about 1.5 mm shifted from the first end of the first conductor 110a toward one side (the left position in FIG. 5), and an end point of the center line Lc is at a position about 1.5 mm shifted from the second end of the second conductor 110b toward the other side (the right position in FIG. 5).

Figure 5:
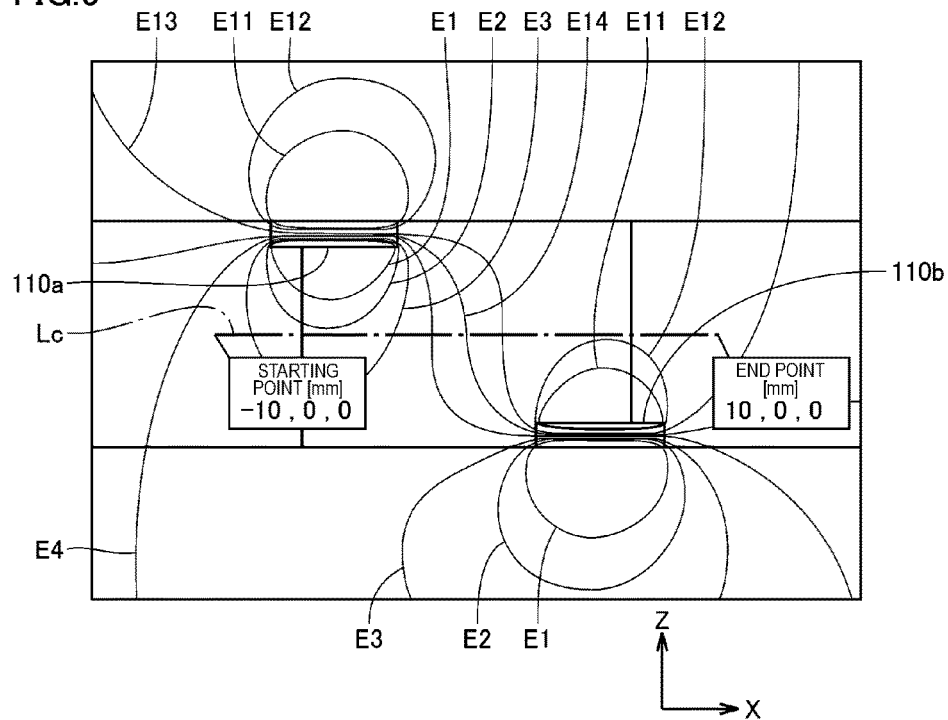
FIG. 5 is a contour diagram showing, in the same cross section as that of FIG. 3, the result of simulation analysis of the magnetic flux density of a magnetic field to be measured that is generated when the current to be measured is passed through the primary conductor.

FIG. 5 is a contour diagram showing, in the same cross section as that of FIG. 3, the result of simulation analysis of the magnetic flux density of the measured magnetic field generated when the current to be measured is passed through the primary conductor. In FIG. 5, magnetic flux densities of the magnetic field directed toward one side in the width direction (X-axis direction) of the primary conductor 110 are denoted by E1 to E4 in the decreasing order, and the magnetic flux densities of the magnetic field directed toward the other side in the width direction (X-axis direction) of the primary conductor 110 are denoted by E11 to E14 in the decreasing order.

Figure 6:
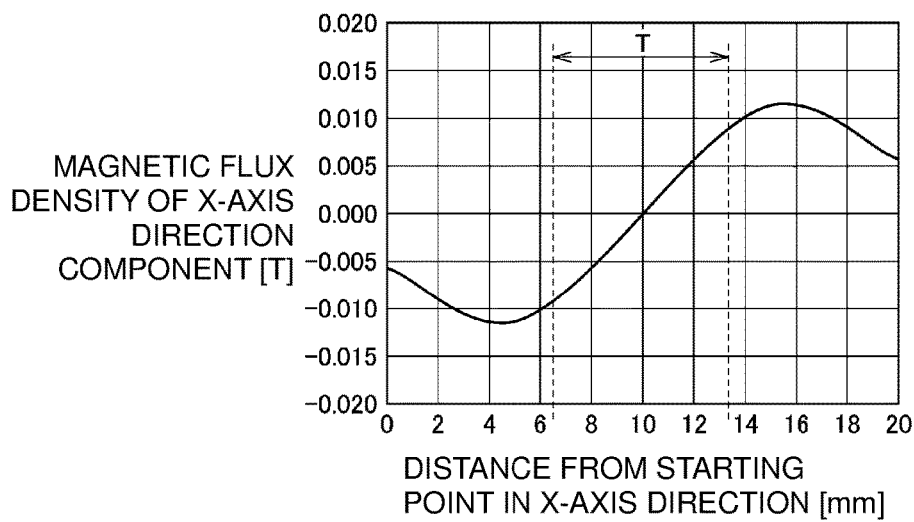
FIG. 6 is a graph showing the change of the magnetic flux density of an X-axis direction component from a starting point to an end point on a center line Lc in FIG. 5.

FIG. 6 is a graph showing the change of the magnetic flux density of the X-axis direction component from the starting point to the end point on the center line Lc in FIG. 5. In FIG. 6, the vertical axis shows the magnetic flux density (T) of the x-axis direction component, and the horizontal axis shows the distance (mm) from the starting point in the X-axis direction.

As shown in FIG. 5, a magnetic field directed toward one side in the width direction (X-axis direction) of the primary conductor 110 is generated under the first conductor 110a and under the second conductor 110b. A magnetic field directed toward the other side in the width direction (X-axis direction) of the primary conductor 110 is generated on the first conductor 110a and on the second conductor 110b.

As illustrated in FIG. 6, the absolute value of the magnetic flux density of the magnetic field directed toward one side in the width direction (X-axis direction) of the primary conductor 110 is the largest at a position below the center of the first conductor 110a, and the absolute value of the magnetic flux density of the magnetic field directed toward the other side in the width direction (X-axis direction) of the primary conductor 110 is the largest at a position above the center of the second conductor 110b.

In a robust region T of FIG. 6, the magnetic flux density of the magnetic field directed toward the other side in the width direction (X-axis direction) of the primary conductor 110 increases in proportion to the distance from the starting point. That is, in the robust region T, high linearity is maintained between the position in the width direction (X-axis direction) of the primary conductor 110 and the magnetic flux density of the measured magnetic field in the width direction (X-axis direction) of the primary conductor 110.

The length of the robust region T in the width direction (X-axis direction) of the primary conductor 110 is more than the width Mb of the horizontal gap of the primary conductor 110. That is, the robust region T includes a gap region between the first conductor 110a and the second conductor 110b in the width direction (X-axis direction) of the primary conductor 110.

In the current sensor 100 of this preferred embodiment, the distance Mc is less than or equal to the distance Mb in the width direction (X-axis direction) of the primary conductor 110, the first magnetic sensor element 120a is disposed at the position where the magnetic field component of the measured magnetic field directed toward one side in the width direction (X-axis direction) of the primary conductor 110 is applied, and the second magnetic sensor element 120b is disposed at the position where the magnetic field component of the measured magnetic field directed toward the other side in the width direction (X-axis direction) of the primary conductor 110 is applied. For this reason, at least a portion of each of the first magnetic sensor element 120a and the second magnetic sensor element 120b is located inside the robust region T. As a result, at least a portion of each of the first magnetic sensor element 120a and the second magnetic sensor element 120b is provided between the first flow portion and the second flow portion in the width direction (X-axis direction) of the primary conductor 110.

As described above, in the robust region T, high linearity is maintained between the position in the width direction (X-axis direction) of the primary conductor 110 and the magnetic flux density of the measured magnetic field in the width direction (X-axis direction) of the primary conductor 110. Hence, when the position of the first magnetic sensor element 120a and the position of the second magnetic sensor element 120b in the width direction (X-axis direction) of the primary conductor 110 are both displaced inside the robust region T, the value obtained by subtracting the detection value of the first magnetic sensor element 120a from the detection value of the second magnetic sensor element 120b is constant or substantially constant, but hardly changes.

As a result, it is possible to reduce the measurement error of the current sensor 100 resulting from the displacement of the first magnetic sensor element 120a and the second magnetic sensor element 120b relative to the primary conductor 110 through which the current to be measured flows.

When each of the center of the first magnetic sensor element 120a and the center of the second magnetic sensor element 120b is located between the first conductor 110a and the second conductor 110b in the width direction (X-axis-direction) of the primary conductor 110, not less than half of each of the first magnetic sensor element 120a and the second magnetic sensor element 120b is located inside the robust region T, and therefore, it is possible to stably reduce or eliminate the measurement error of the current sensor 100 resulting from the displacement of the first magnetic sensor element 120a and the second magnetic sensor element 120b.

When each of the first magnetic sensor element 120a and the second magnetic sensor element 120b is entirely located between the first conductor 110a and the second conductor 110b in the width direction (X-axis direction) of the primary conductor 110, it is possible to minimize or significantly reduce the measurement error of the current sensor 100 resulting from the displacement of the first magnetic sensor element 120a and the second magnetic sensor element 120b.

Next, a description will be given of the result of simulation analysis that verifies the influence of the width Mb of the horizontal gap of the primary conductor 110 and the width Hb of the vertical gap of the primary conductor 110 on the output error of the current sensor due to the displacement of the magnetic sensor elements.

As common conditions of the simulation analysis, the width and thickness of each of the first conductor 110a and the second conductor 110b were set at about 5.5 mm and about 1.5 mm, respectively. A current of about 300 A was passed through each of the first conductor 110a and the second conductor 110b.

The simulation analysis was performed while changing the width Mb of the horizontal gap of the primary conductor 110 in eight ways of about 0.5, about 1, about 2, about 2.75, about 3, about 5, about 10, and about 15 and the width Hb of the vertical gap of the primary conductor 110 in four ways of about 2.5, about 3.5, about 5, and about 10, that is, changing the condition in a total of 32 ways. The width Mb of the horizontal gap of the primary conductor 110 and the width Hb of the vertical gap of the primary conductor 110 were normalized by the sensor distance Mc.

Figure 7:
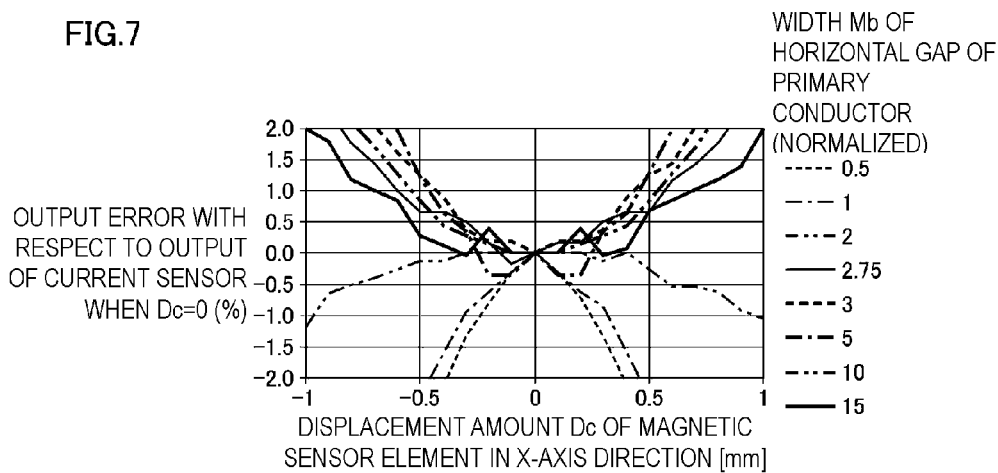
FIG. 7 is a graph showing the result of simulation analysis of the error distribution of the current sensor when a width Hb of a vertical gap of the primary conductor 110 is about 2.5 and a width Mb of a horizontal gap of the primary conductor 110 is changed in eight ways.
Figure 8:
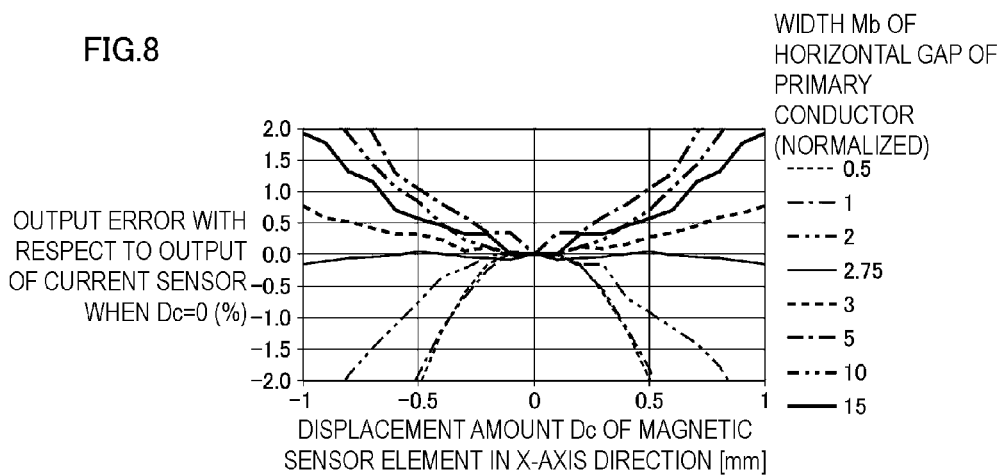
FIG. 8 is a graph showing the result of simulation analysis of the error distribution of the current sensor when the width Hb of the vertical gap of the primary conductor 110 is about 3.5 and the width Mb of the horizontal gap of the primary conductor 110 is changed in eight ways.
Figure 9:
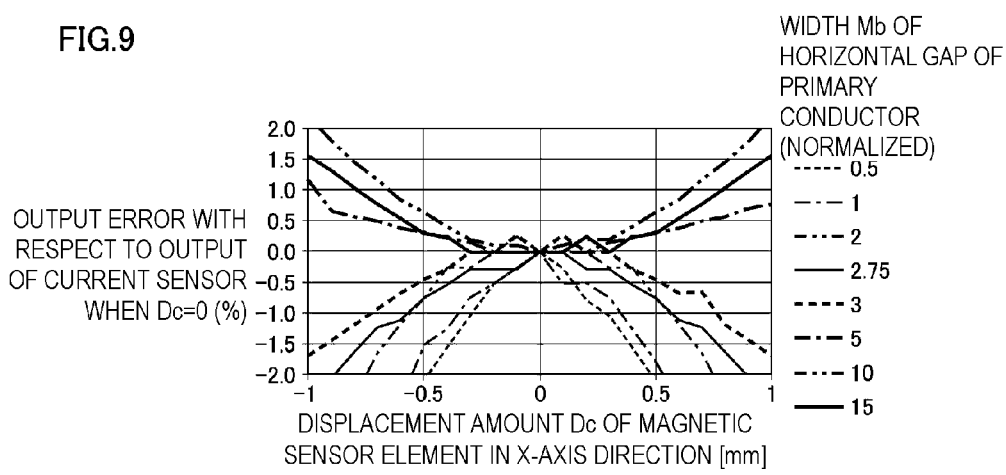
FIG. 9 is a graph showing the result of simulation analysis of the error distribution of the current sensor when the width Hb of the vertical gap of the primary conductor 110 is about 5 and the width Mb of the horizontal gap of the primary conductor 110 is changed in eight ways.
Figure 10:
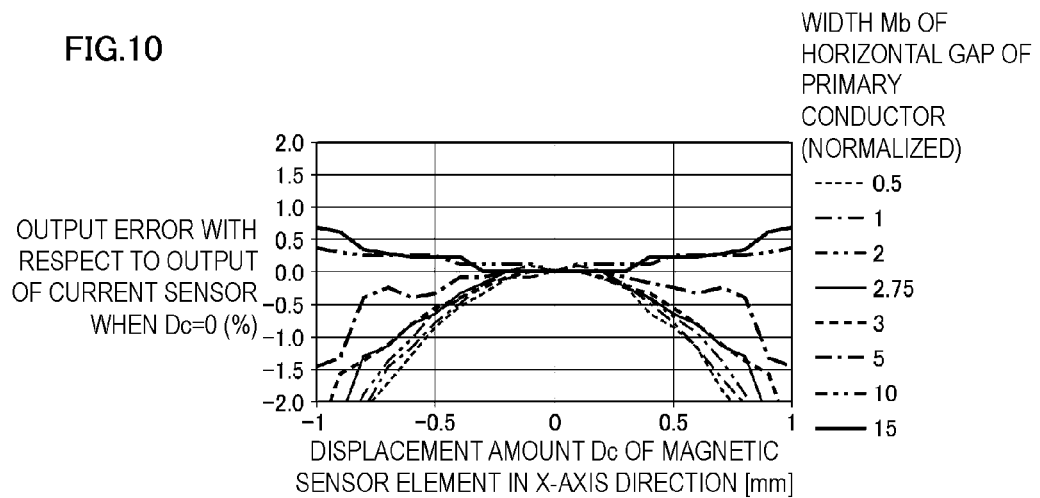
FIG. 10 is a graph showing the result of simulation analysis of the error distribution of the current sensor when the width Hb of the vertical gap of the primary conductor 110 is about 10 and the width Mb of the horizontal gap of the primary conductor 110 is changed in eight ways.

FIG. 7 is a graph showing the result of simulation analysis conducted on the error distribution of the current sensor while setting the width Hb of the vertical gap of the primary conductor 110 at about 2.5 and changing the width Mb of the horizontal gap of the primary conductor 110 in eight ways. FIG. 8 is a graph showing the result of simulation analysis conducted on the error distribution of the current sensor while setting the width Hb of the vertical gap of the primary conductor 110 at about 3.5 and changing the width Mb of the horizontal gap of the primary conductor 110 in eight ways. FIG. 9 is a graph showing the result of simulation analysis conducted on the error distribution of the current sensor while setting the width Hb of the vertical gap of the primary conductor 110 at about 5 and changing the width Mb of the horizontal gap of the primary conductor 110 in eight ways. FIG. 10 is a graph showing the result of simulation analysis conducted on the error distribution of the current sensor while setting the width Hb of the vertical gap of the primary conductor 110 at about 10 and changing the width Mb of the horizontal gap of the primary conductor 110 in eight ways.

In FIGS. 7 to 10, the vertical axis shows the output error (%) with respect to the output from the current sensor when the displacement amount Dc=0, and the horizontal axis shows the displacement amount Dc (mm) of the magnetic sensor element in the width direction (X-axis direction) of the primary conductor 110. As the displacement amount Dc, the displacement amount on one side in the width direction (X-axis direction) of the primary conductor 110 is shown by a negative value, and the displacement amount on the other side in the width direction (X-axis direction) of the primary conductor 110 is shown by a positive value. Data on Mb=0.5 is shown by a dotted line, data on Mb=1 is shown by a one-dot chain line, data on Mb=2 is shown by a two-dot chain line, data on Mb=2.75 is shown by a solid line, data on Mb=3 is shown by a thick dotted line, data on Mb=5 is shown by a thick one-dot chain line, data on Mb=10 is shown by a thick two-dot chain line, and data on Mb=15 is shown by a thick solid line.

Figure 11:
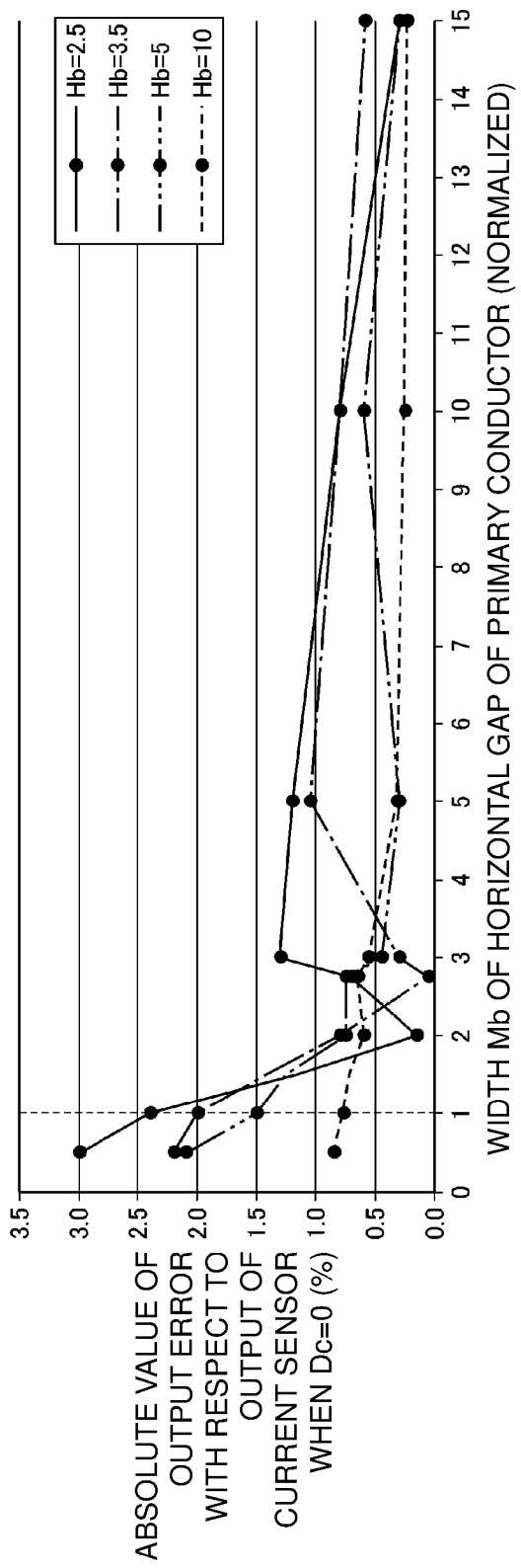
FIG. 11 is a graph showing the result of simulation analysis of the distribution of the absolute value of the error of the current sensor when a displacement amount Dc of a magnetic sensor element in the X-axis direction is about 0.5 mm and the width Hb of the vertical gap of the primary conductor 110 is changed in four ways.

FIG. 11 is a graph showing the result of simulation analysis conducted on the distribution of the absolute value of error of the current sensor while setting the displacement amount Dc in the X-axis direction of the magnetic sensor element at about 0.5 mm and changing the width Hb of the vertical gap of the primary conductor 110 in four ways. In FIG. 11, the vertical axis shows the absolute value (%) of the output error with respect to the output of the current sensor when the displacement amount Dc=0, and the horizontal axis shows the width Mb of the horizontal gap of the primary conductor 110 (normalized by the sensor distance Mc). Data on Hb=2.5 is shown by a solid line, data on Hb=3.5 is shown by a one-dot chain line, data on Hb=5 is shown by a two-dot chain line, and data on Hb=10 is shown by a solid line.

As shown in FIGS. 7 to 11, the absolute value of the output error of the current sensor was smaller when the width Mb of the horizontal gap of the primary conductor 110 was within the range of 1 to 15, regardless of the width Hb of the vertical gap of the primary conductor 110, than when the width Mb of the horizontal gap of the primary conductor 110 was less than 1. As shown in FIG. 11, when the displacement amount Dc of the magnetic sensor element in the X-axis direction was about 0.5 mm, the absolute value of the output error of the current sensor could be reduced to about 1.5% or less as long as the width Mb of the horizontal gap of the primary conductor 110 was within the range of about 2 to about 15, for example.

From this, it could be confirmed that the measurement error of the current sensor could be reduced when the sensor distance Mc was less than or equal to the width Mb of the horizontal gap, regardless of the width Hb of the vertical gap of the primary conductor 110. Also, it could be confirmed that the measurement error of the current sensor could be greatly reduced when the sensor distance Mc was less than or equal to half the width Mb of the horizontal gap.

In the current sensor 100 according to this preferred embodiment, since the first magnetic sensor element 120a and the second magnetic sensor element 120b are mounted on the single substrate 130, the first magnetic sensor element 120a and the second magnetic sensor element 120b are able to be integrated, and this reduces the size of the current sensor 100.

Figure 12:
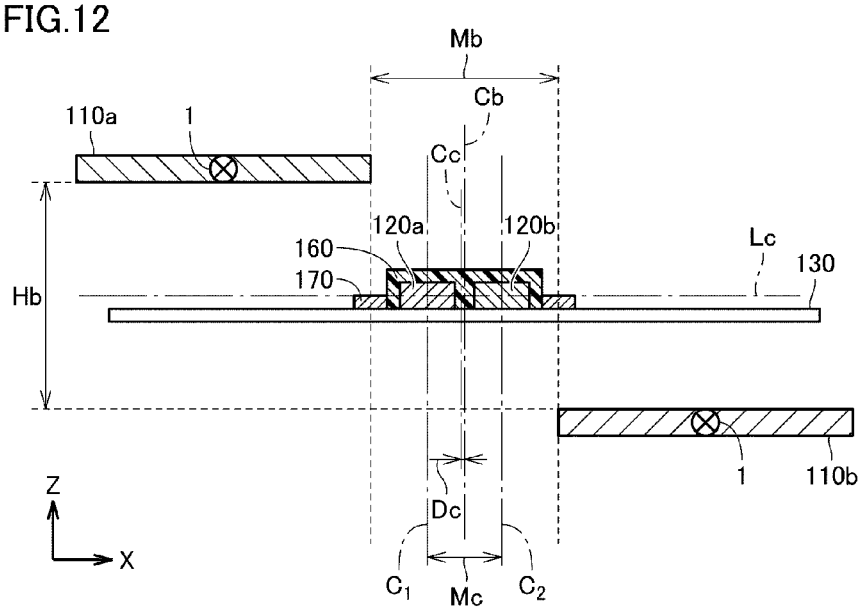
FIG. 12 is a cross-sectional view of a first magnetic sensor element and a second magnetic sensor element in a current sensor according to a first modification of the first preferred embodiment of the present invention.

The first magnetic sensor element 120a and the second magnetic sensor element 120b may be integrated and packaged in one. FIG. 12 is a cross-sectional view of a first magnetic sensor element and a second magnetic sensor element in a current sensor according to a first modification of the first preferred embodiment of the present invention. FIG. 12 shows the same cross section as that of FIG. 2.

As illustrated in FIG. 12, a first magnetic sensor element 120a and a second magnetic sensor element 120b in a current sensor according to the first modification of the first preferred embodiment of the present invention are combined in one by a resin package 160, and are mounted on a substrate 130 with a bonding agent 170. By thus integrating and packaging the first magnetic sensor element 120a and the second magnetic sensor element 120b into one, the size of the current sensor is reduced.

At least a portion of each of the first magnetic sensor element 120a and the second magnetic sensor element 120b may be opposed to a primary conductor 110 in the thickness direction (Z-axis direction) of the primary conductor 110.

Figure 13:
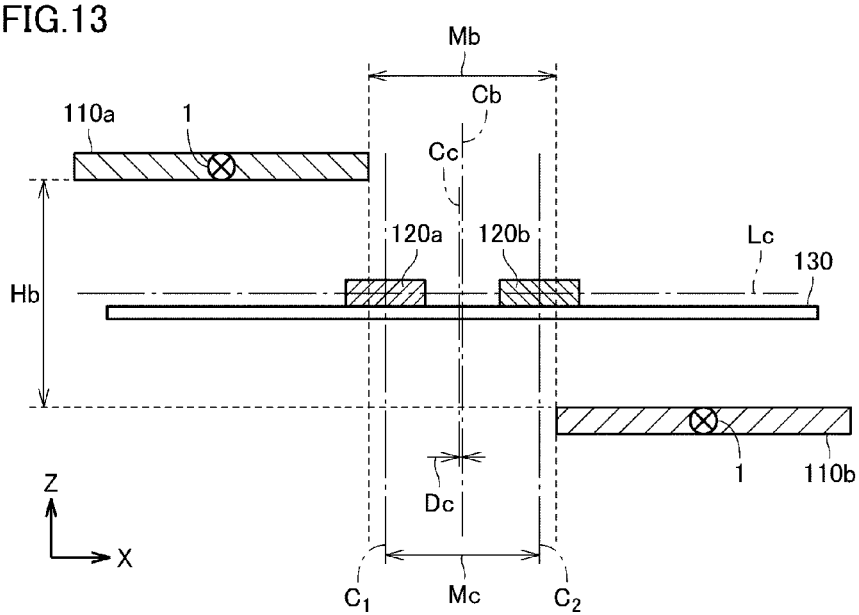
FIG. 13 is a cross-sectional view of a first magnetic sensor element and a second magnetic sensor element in a current sensor according to a second modification of the first preferred embodiment of the present invention.

FIG. 13 is a cross-sectional view of a first magnetic sensor element and a second magnetic sensor element in a current sensor according to a second modification of the first preferred embodiment of the present invention. FIG. 13 shows the same cross section as that of FIG. 2.

As illustrated in FIG. 13, in the current sensor according to the second modification of the first preferred embodiment of the present invention, the sensor distance Mc is increased, and a portion of a first magnetic sensor element 120a and a first conductor 110a are opposed to each other and a portion of a second magnetic sensor element 120b and a second conductor 110b are opposed to each other in the thickness direction (Z-axis direction) of a primary conductor 110. That is, a portion of the first magnetic sensor element 120a overlaps with the first conductor 110a, when viewed from the thickness direction (Z-axis direction) of the primary conductor 110. A portion of the second magnetic sensor element 120b overlaps with the second conductor 110b, when viewed from the thickness direction (Z-axis direction) of the primary conductor 110.

In the current sensor according to the second modification of the first preferred embodiment of the present invention, the center of the first magnetic sensor element 120a and the center of the second magnetic sensor element 120b are each located between the first conductor 110a and the second conductor 110b in the width direction (X-axis direction) of the primary conductor 110. Alternatively, the center of the first magnetic sensor element 120a or the center of the second magnetic sensor element 120b may be located in an outer side portion of the space between the first conductor 110a and the second conductor 110b in the width direction (X-axis direction) of the primary conductor 110.

In the current sensor according to the second modification of the first preferred embodiment of the present invention, at least a portion of each of the first magnetic sensor element 120a and the second magnetic sensor element 120b is opposed to the primary conductor 110 in the thickness direction (Z-axis direction) of the primary conductor 110. Hence, a magnetic field component in the width direction (X-axis direction) of the primary conductor 110 in a measured magnetic field acting on each of the first magnetic sensor element 120a and the second magnetic sensor element 120b is able to be increased. This increases the output of the current sensor.

On the other hand, as the ratio of the portions of the first magnetic sensor element 120a and the second magnetic sensor element 120b opposed to the primary conductor 110 in the thickness direction (Z-axis direction) of the primary conductor 110 increases, the effect of reducing the measurement error of the current sensor resulting from the displacement of the first magnetic sensor element 120a and the second magnetic sensor element 120b decreases. For this reason, when the center of the first magnetic sensor element 120a and the center of the second magnetic sensor element 120b are each located between the first conductor 110a and the second conductor 110b in the width direction (X-direction) of the primary conductor 110, a high effect of reducing the measurement error of the current sensor resulting from the displacement of the first magnetic sensor element 120a and the second magnetic sensor element 120b is able to be maintained.

Hence, in the current sensor according to the second modification of the first preferred embodiment of the present invention, the center of the first magnetic sensor element 120a and the center of the second magnetic sensor element 120b are each located between the first conductor 110a and the second conductor 110b in the width direction (X-axis direction) of the primary conductor 110, and a portion of each of the first magnetic sensor element 120a and the second magnetic sensor element 120b is opposed to the primary conductor 110 in the thickness direction (Z-axis direction) of the primary conductor 110. This increases the output from the current sensor while reducing the measurement error of the current sensor resulting from the displacement of the first magnetic sensor element 120a and the second magnetic sensor element 120b.

Second Preferred Embodiment

A current sensor according to a second preferred embodiment of the present invention will be described below. A current sensor 200 according to the second preferred embodiment is mainly different from the current sensor 100 of the first preferred embodiment in that a primary conductor is defined by a single conductor. Structures similar to those of the current sensor 100 of the first preferred embodiment are denoted by the same reference signs, and descriptions thereof are not repeated.

Figure 14:
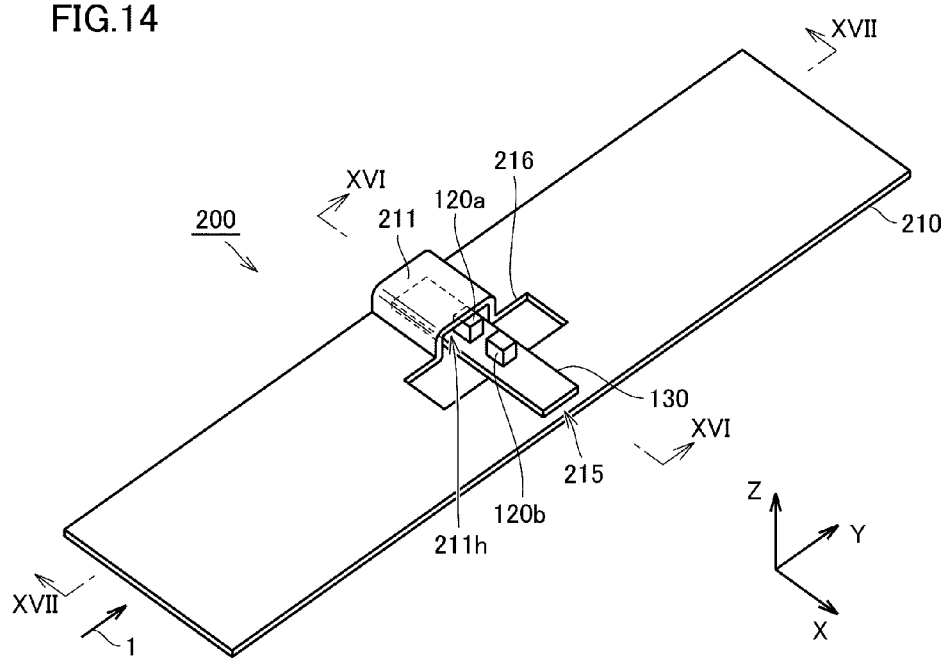
FIG. 14 is a perspective view illustrating an outward appearance of a current sensor according to a second preferred embodiment of the present invention.
Figure 15:
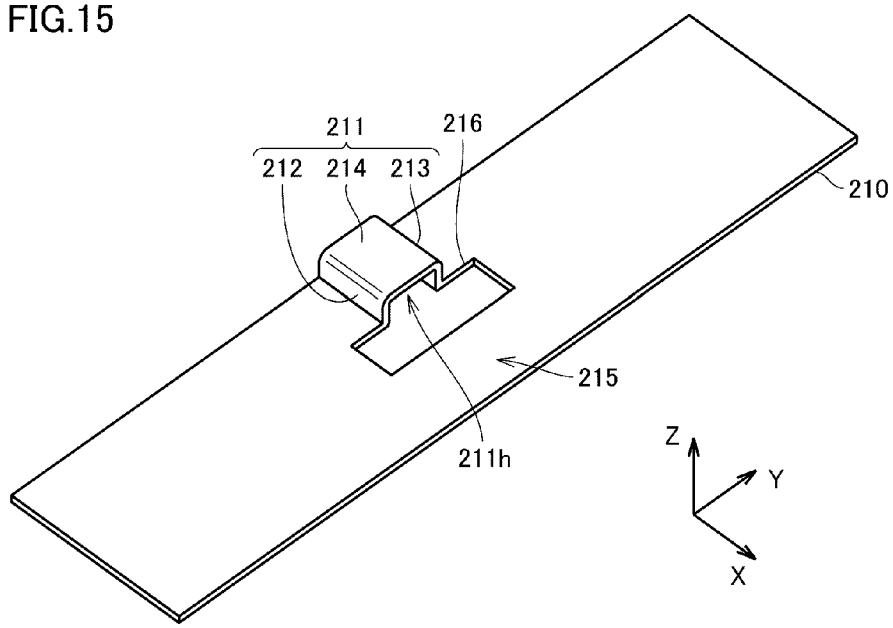
FIG. 15 is a perspective view illustrating an outward appearance of a primary conductor provided in the current sensor according to the second preferred embodiment of the present invention.
Figure 16:
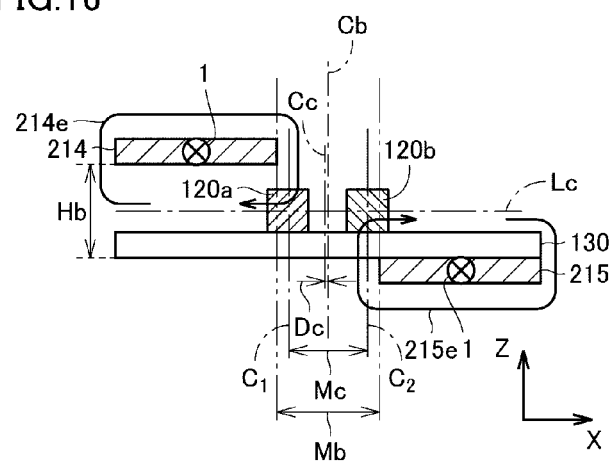
FIG. 16 is a cross-sectional view of the current sensor according to the second preferred embodiment of the present invention, when viewed from a direction of arrow XVI-XVI in FIG. 14.
Figure 17:
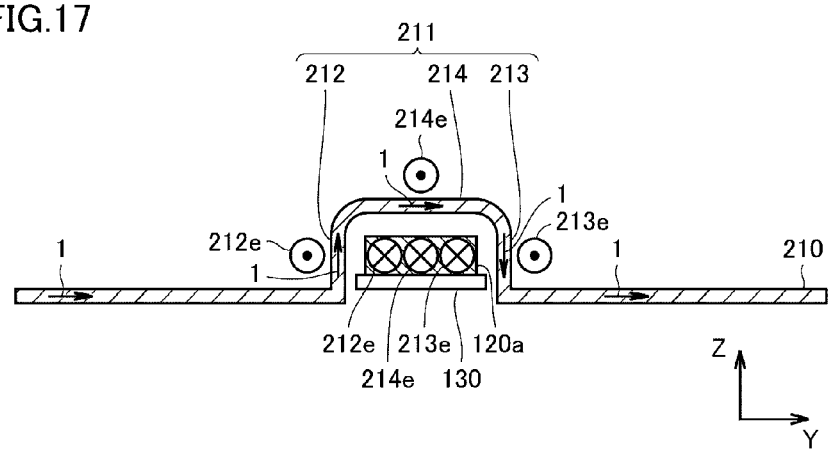
FIG. 17 is a cross-sectional view of the current sensor according to the second preferred embodiment of the present invention, when viewed from a direction of arrow XVII-XVII in FIG. 14.

FIG. 14 is a perspective view illustrating an outward appearance of the current sensor according to the second preferred embodiment of the present invention. FIG. 15 is a perspective view illustrating an outward appearance of a primary conductor provided in the current sensor according to the second preferred embodiment of the present invention. FIG. 16 is a cross-sectional view of the current sensor according to the second preferred embodiment of the present invention, when viewed from a direction of arrow XVI-XVI in FIG. 14. FIG. 17 is a cross-sectional view of the current sensor according to the second preferred embodiment of the present invention, when viewed from a direction of arrow XVII-XVII in FIG. 14. In FIGS. 14 to 17, the width direction of a primary conductor 210 is shown as an X-axis direction, the length direction of the primary conductor 210 is shown as a Y-axis direction, and the thickness direction of the primary conductor 210 is shown as a Z-axis direction.

As illustrated in FIGS. 14 to 17, the current sensor 200 according to the second preferred embodiment of the present invention includes a primary conductor 210 through which a current to be measured flows, and a first magnetic sensor element 120a and a second magnetic sensor element 120b that detect the intensity of a magnetic field generated by the measured current flowing through the primary conductor 210. The current to be measured is shunted into two flow passages, as will be described later, and flows through the primary conductor 210 in the length direction (Y-axis direction) of the primary conductor 210, as shown by arrow 1.

The primary conductor 210 includes an arch-shaped portion 211 that bends and projects toward one side in the thickness direction (Z-axis direction) of the primary conductor 210 and extends in the length direction (Y-axis direction) to define a first flow portion of two flow passages. That is, the first flow portion bulges out toward a front side of the primary conductor 110, when viewed from the width direction (X-axis direction). A second flow portion of the two flow passages is defined by a flat portion 215 disposed beside the arch-shaped portion 211 in the width direction (X-axis direction) of the primary conductor 210. That is, the second flow portion is flat.

The primary conductor 210 includes a slit 216 extending in the length direction (Y-axis direction) of the primary conductor 210. The slit 216 is adjacent to the arch-shaped portion 211 in the width direction (X-axis direction) of the primary conductor 210. That is, the slit 216 is provided between the arch-shaped portion 211 and the flat portion 215. In this way, in the current sensor 200, the primary conductor 210 has the slit 216 provided between the first flow portion and the second flow portion to extend in the length direction (Y-axis direction).

Since the slit 216 is provided, a horizontal gap of the primary conductor 210 is provided between the arch-shaped portion 211 and the flat portion 215. That is, the width of the slit 216 defines the width Mb of the horizontal gap of the primary conductor 110.

When viewed from the width direction (X-axis direction) of the primary conductor 210, a cavity 211h communicating with the inside of the arch-shaped portion 211 is provided between the arch-shaped portion 211 and the flat portion 215. That is, when viewed from the width direction (X-axis direction), the cavity 211h is provided as a region surrounded by the first flow portion and the second flow portion.

As illustrated in FIG. 15, in this preferred embodiment, the arch-shaped portion 211 includes a first projecting portion 212 and a second projecting portion 213 projecting with a space therebetween to be perpendicular or substantially perpendicular to a principal surface of the primary conductor 210, and an extending portion 214 extending in the length direction (Y-axis direction) of the primary conductor 210 to connect the first projecting portion 212 and the second projecting portion 213.

A vertical gap of the primary conductor 210 is provided between the extending portion 214 and the flat portion 215. That is, the distance between the extending portion 214 and the flat portion 215 in the thickness direction (Z-axis direction) of the primary conductor 210 defines the width Hb of the vertical gap of the primary conductor 210. However, the shape of the arch-shaped portion 211 is not limited thereto, and for example, the arch-shaped portion 211 may be C-shaped or semicircular, when viewed from the width direction (X-axis direction) of the primary conductor 210.

A portion of a substrate 130 on which the first magnetic sensor element 120a and the second magnetic sensor element 120b are mounted is inserted in the cavity 211h. The remaining portion of the substrate 130 is disposed on the flat portion 215. Thus, a portion of the first magnetic sensor element 120a is disposed inside the arch-shaped portion 211 to be located on the back side of the extending portion 214. A portion of the second magnetic sensor element 120b is located on the front side of the flat portion 215. That is, the first magnetic sensor element 120a and the second magnetic sensor element 120b are provided between the first flow portion and the second flow portion in the thickness direction (Z-axis direction) of the primary conductor 210, and are arranged side by side in the width direction (X-axis direction) of the primary conductor 210.

While the substrate 130 is disposed so that the mounting surface of the substrate 130 is parallel or substantially parallel to the front surface of the flat portion 215 in this preferred embodiment, it may be disposed so that the mounting surface of the substrate 130 is perpendicular or substantially perpendicular to the front surface of the flat portion 215.

As illustrated in FIG. 16, a measured current flowing through the primary conductor 210 separately flows through two flow passages, that is, a first flow portion passing through the arch-shaped portion 211 and a second flow portion passing through the flat portion 215. Since the current separately flows through the two flow passages in the primary conductor 210, a magnetic field passing around the first flow portion and a magnetic field passing around the second flow portion are generated by the so-called Ampere's circuital law.

As illustrated in FIGS. 16 and 17, since a portion of the first magnetic sensor element 120a is disposed inside the arch-shaped portion 211, a magnetic field 212e passing around the first projecting portion 212, a magnetic field 213e passing around the second projecting portion 213, and a magnetic field 214e passing around the extending portion 214 are applied to the first magnetic sensor element 120a. Thus, since the intensity of the magnetic field applied to a magneto resistance element in the first magnetic sensor element 120a increases, the sensitivity of the first magnetic sensor element 120a to the measured current flowing through the primary conductor 210 increases. A magnetic field 215e passing around the flat portion 215 is applied to the second magnetic sensor element 120b.

The direction of the magnetic flux in the width direction (X-axis direction) of the primary conductor 110 is opposite between the position on the back side of the extending portion 214 and the position on the front side of the flat portion 215. That is, since the direction of the magnetic flux acting on the first magnetic sensor element 120a and the direction of the magnetic flux acting on the second magnetic sensor element 120b are opposite from each other, the phase of the detection value of the first magnetic sensor element 120a and the phase of the detection value of the second magnetic sensor element 120b for the intensity of the magnetic field generated by the measured current flowing through the primary conductor 210 are opposite from each other.

As described above, the sensitivity of the current sensor 200 of this preferred embodiment is able to be increased by increasing the sensitivity of the first magnetic sensor element 120a to the measured current flowing through the primary conductor 210.

Further, in the current sensor 200, a portion of the substrate 130 on which the first magnetic sensor element 120a and the second magnetic sensor element 120b are mounted is inserted in the cavity 211h, and the remaining portion of the substrate 130 is disposed on the flat portion 215. Hence, it is possible to achieve a low profile, integration, and size reduction of the current sensor 200.

Further, in the current sensor 200 of this preferred embodiment, the substrate 130 on which the first magnetic sensor element 120a and the second magnetic sensor element 120b are mounted is assembled to the single primary conductor 210. Hence, the current sensor 200 is easily assembled, and the number of components and cost are reduced compared to when two primary conductors are used.

Third Preferred Embodiment

A current sensor according to a third preferred embodiment of the present invention will be described below. A current sensor 300 according to the third preferred embodiment is different from the current sensor 200 of the second preferred embodiment only in that a primary conductor includes an inverse-arch-shaped portion instead of the flat portion. Hence, structures similar to those of the current sensor 200 of the second preferred embodiment are denoted by the same reference signs, and descriptions thereof are not repeated.

Figure 18:
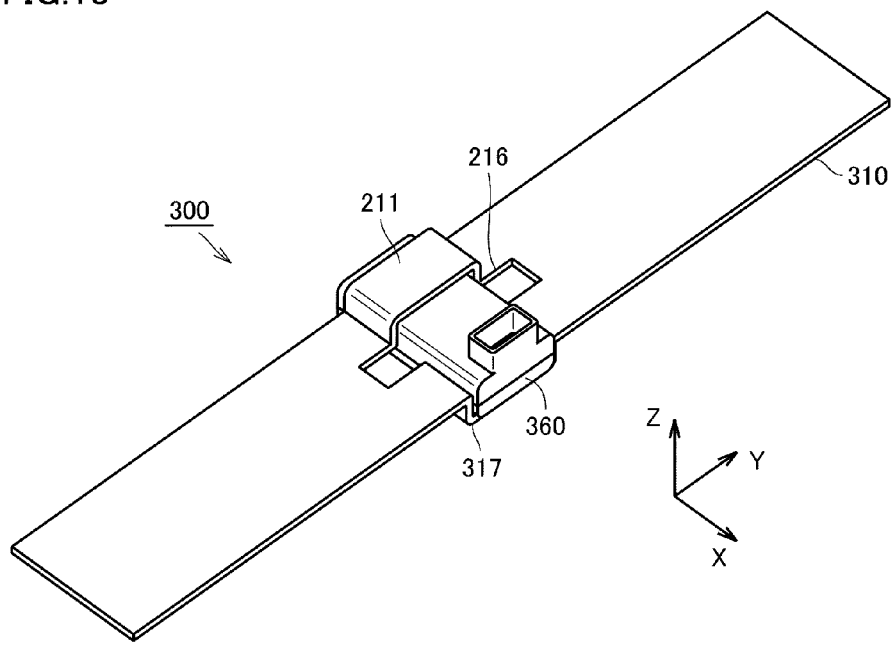
FIG. 18 is a perspective view illustrating an outward appearance of a current sensor according to a third preferred embodiment of the present invention.
Figure 19:
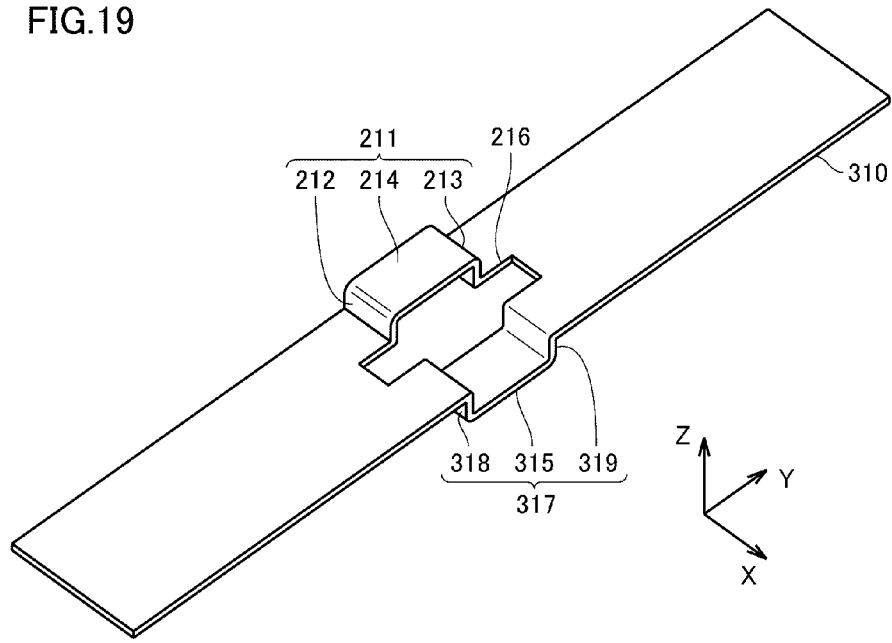
FIG. 19 is a perspective view illustrating an outward appearance of a primary conductor provided in the current sensor according to the third preferred embodiment of the present invention.
Figure 20:
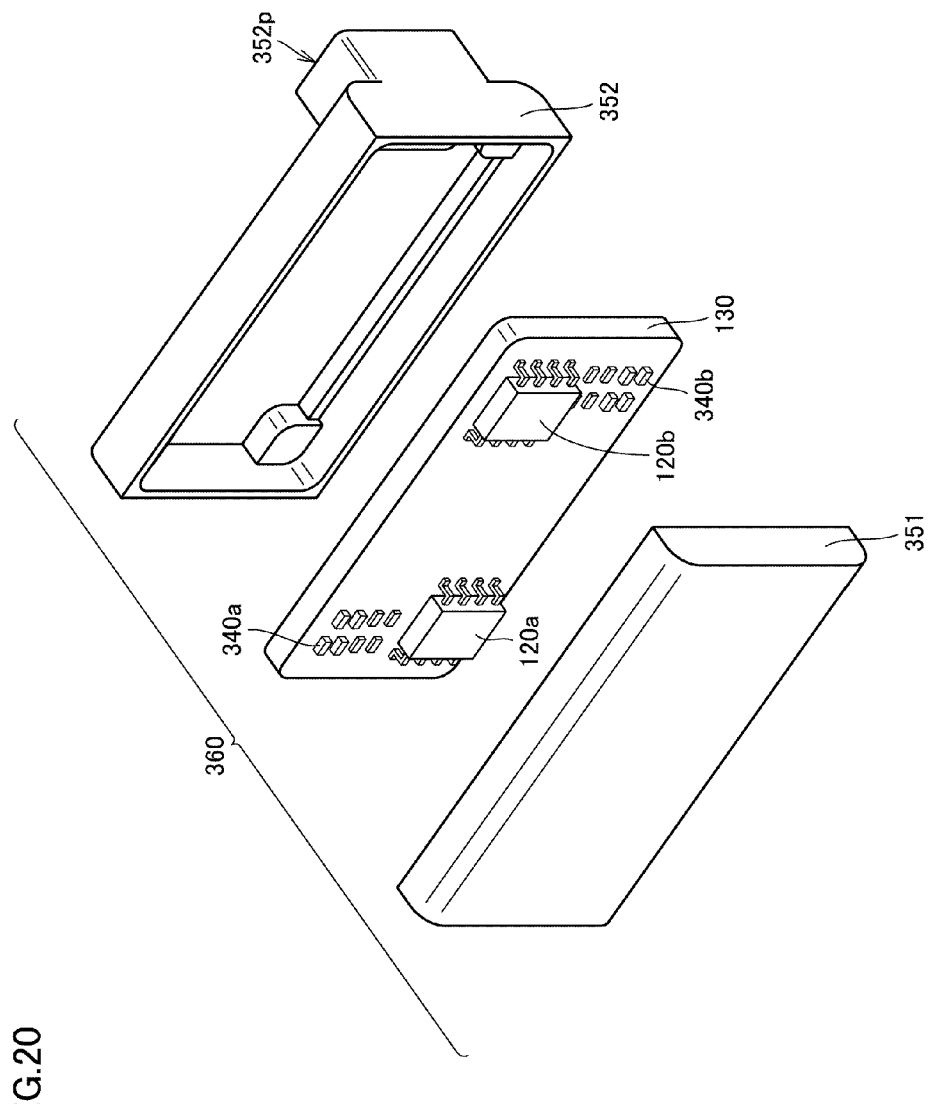
FIG. 20 is an exploded perspective view illustrating a structure of a magnetic sensor unit provided in the current sensor according to the third preferred embodiment of the present invention.
Figure 21:
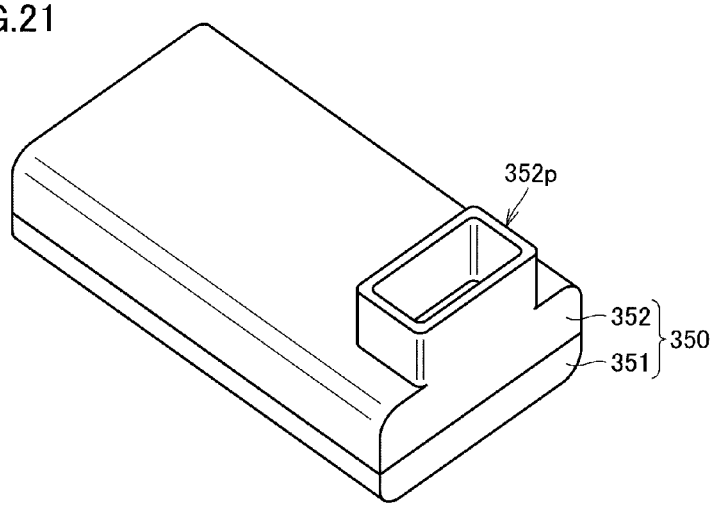
FIG. 21 is a perspective view illustrating an outward appearance of a housing of the magnetic sensor unit provided in the current sensor according to the third preferred embodiment of the present invention.

FIG. 18 is a perspective view illustrating an outward appearance of the current sensor according to the third preferred embodiment of the present invention. FIG. 19 is a perspective view illustrating an outward appearance of a primary conductor provided in the current sensor according to the third preferred embodiment of the present invention. FIG. 20 is an exploded perspective view illustrating a structure of a magnetic sensor unit provided in the current sensor according to the third preferred embodiment of the present invention. FIG. 21 is a perspective view illustrating an outward appearance of a housing of the magnetic sensor unit provided in the current sensor according to the third preferred embodiment of the present invention.

As illustrated in FIGS. 18 to 21, the current sensor 300 according to the third preferred embodiment of the present invention includes a primary conductor 310 through which a current to be measured flows and a first magnetic sensor element 120a and a second magnetic sensor element 120b each of which detects the intensity of a magnetic field generated by the measured current flowing through the primary conductor 310.

In the current sensor 300 of this preferred embodiment, on a side of a slit 216 opposite from an arch-shaped portion 211 in the primary conductor 310, an inverse-arch-shaped portion 317 is provided to bend and project toward the other side in the thickness direction (Z-axis direction) of the primary conductor 310, to extend in the length direction (Y-axis direction) of the primary conductor 310, and to constitute another flow passage. The inverse-arch-shaped portion 317 is disposed adjacently to the slit 216 and beside the arch-shaped portion 211 in the width direction (X-axis direction) of the primary conductor 310. The slit 216 is located in a center portion of the primary conductor 310 in the width direction (X-axis direction) of the primary conductor 310. The slit 216 is located between the arch-shaped portion 211 and the inverse-arch-shaped portion 317.

As illustrated in FIG. 19, in this preferred embodiment, the inverse-arch-shaped portion 317 includes a third projecting portion 318 and a fourth projecting portion 319 projecting with a space therebetween to be perpendicular or substantially perpendicular to the principal surface of the primary conductor 310 and an extending portion 315 extending in the length direction (Y-axis direction) of the primary conductor 310 to connect the third projecting portion 318 and the fourth projecting portion 319.

A vertical gap of the primary conductor 310 is provided between the extending portion 214 and the extending portion 315. That is, the distance between the extending portion 214 and the extending portion 315 in the thickness direction (Z-axis direction) of the primary conductor 310 defines the width Hb of the vertical gap of the primary conductor 310. However, the shape of the inverse-arch-shaped portion 317 is not limited thereto, and, for example, the inverse-arch-shaped portion 317 may be C-shaped or semicircular, when viewed from the width direction (X-axis direction) of the primary conductor 310. The arch-shaped portion 211 and the inverse-arch-shaped portion 317 have the same shape. That is, the shapes of a first flow portion and a second flow portion are point-symmetrical with respect to each other.

As illustrated in FIG. 20, the first magnetic sensor element 120a and the second magnetic sensor element 120b are mounted on a substrate 130 together with electronic components 340a and 340b such as an amplifier and a passive element. In this preferred embodiment, the first magnetic sensor element 120a and the second magnetic sensor element 120b are arranged side by side in the width direction (X-axis direction) of the primary conductor 310 while being shifted from each other in the length direction (Y-axis direction) of the primary conductor 310. The substrate 130 is fixed inside a housing 350 having an electric insulating property to define a magnetic sensor unit 360. That is, the first magnetic sensor element 120a, the second magnetic sensor element 120b, the electronic components 340a and 340b, and the substrate 130 are stored in the housing 350.

As illustrated in FIGS. 20 and 21, the housing 350 has an outer shape like a rectangular or substantially rectangular parallelepiped, and includes a lower housing portion 351 and an upper housing portion 352. The upper housing portion 352 includes a take-out port 352p for a wire harness to be connected to the substrate 130.

The housing 350 is made of an engineering plastic material such as PPS (polyphenylene sulfide). Since PPS has highly heat-resistant, it is suitably used as the material of the housing 350 in consideration of heat generation of the primary conductor 310.

As a method for fixing the substrate 130 to the housing 350, for example, fastening with screws, heat welding with resin, or bonding with an adhesive is able to be used. When the substrate 130 and the housing 350 are fastened with screws, nonmagnetic screws are preferably used to prevent disturbance of the magnetic field.

The magnetic sensor unit 360 is inserted in a space defined by the arch-shaped portion 211 and the inverse-arch-shaped portion 317. Thus, a portion of the first magnetic sensor element 120a is disposed inside the arch-shaped portion 211 to be located on the back side of the extending portion 214, and a portion of the second magnetic sensor element 120b is disposed inside the inverse-arch-shaped portion 317 to be located on the front side of the extending portion 315.

In the above-described state, the housing 350 is in contact with at least a portion of an inner surface of the arch-shaped portion 211. For example, the upper housing portion 352 is in contact with at least a portion of a back surface of the extending portion 214. The housing 350 is also in contact with at least a portion of an inner surface of the inverse-arch-shaped portion 317. For example, the lower housing portion 351 is in contact with at least a portion of a front surface of the extending portion 315.

Thus, the distance between the first magnetic sensor element 120a and the arch-shaped portion 211 and the distance between the second magnetic sensor element 120b and the inverse-arch-shaped portion 317 are able to be decreased, and variations in the position of the first magnetic sensor element 120a relative to the arch-shaped portion 211 and variations in the position of the second magnetic sensor element 120b relative to the inverse-arch-shaped portion 317 are able to be reduced. This reduces variations in measurement accuracy while increasing the sensitivity of the current sensor 300. As a result, measurement reproducibility and mass productivity of the current sensor 300 is able to be increased. Also, the arch-shaped portion 211 and the inverse-arch-shaped portion 317 protect the components of the magnetic sensor unit 360 from external forces.

In this preferred embodiment, the center of the slit 216 is located in the middle portion between the first magnetic sensor element 120a and the second magnetic sensor element 120b in the width direction (X-axis direction) of the primary conductor 310, when viewed from the thickness direction (Z-axis direction) of the primary conductor 310. The first magnetic sensor element 120a and the second magnetic sensor element 120b are located in the middle portion between the first flow portion and the second flow portion in the thickness direction (Z-axis direction) of the primary conductor 310. Thus, the positional relationship between the first magnetic sensor element 120a and the primary conductor 310 and the positional relationship between the second magnetic sensor element 120b and the primary conductor 310 are able to be almost the same.

In this preferred embodiment, since a portion of the second magnetic sensor element 120b is disposed inside the inverse-arch-shaped portion 317, a magnetic field passing around the third projecting portion 318, a magnetic field passing around the fourth projecting portion 319, and a magnetic field passing around the extending portion 315 are applied to the second magnetic sensor element 120b. Since this increases the magnetic field applied to a magneto resistance element in the second magnetic sensor element 120b, the sensitivity of the second magnetic sensor element 120b to the measured current flowing through the primary conductor 310 increases.

The sensitivity of the current sensor 300 according to this preferred embodiment is able to be increased by increasing the sensitivities of the first magnetic sensor element 120a and the second magnetic sensor element 120b to the measured current flowing through the primary conductor 310.

Since the electric resistance of the arch-shaped portion 211 is substantially equal to the electric resistance of the inverse-arch-shaped portion 317 in the current sensor 300 of this preferred embodiment, the heating amount of the arch-shaped portion 211 and the heating amount of the inverse-arch-shaped portion 317 due to the flow of the measured current through the primary conductor 310 are able to be made equal. As a result, the temperature around the magneto resistance element of the first magnetic sensor element 120a is able to be equal or substantially equal to the temperature around the magneto resistance element of the second magnetic sensor element 120b. Hence, it is possible to reduce the error of the measurement value of the current sensor 300 due to the temperature characteristics of the magneto resistance elements.

Figure 22:
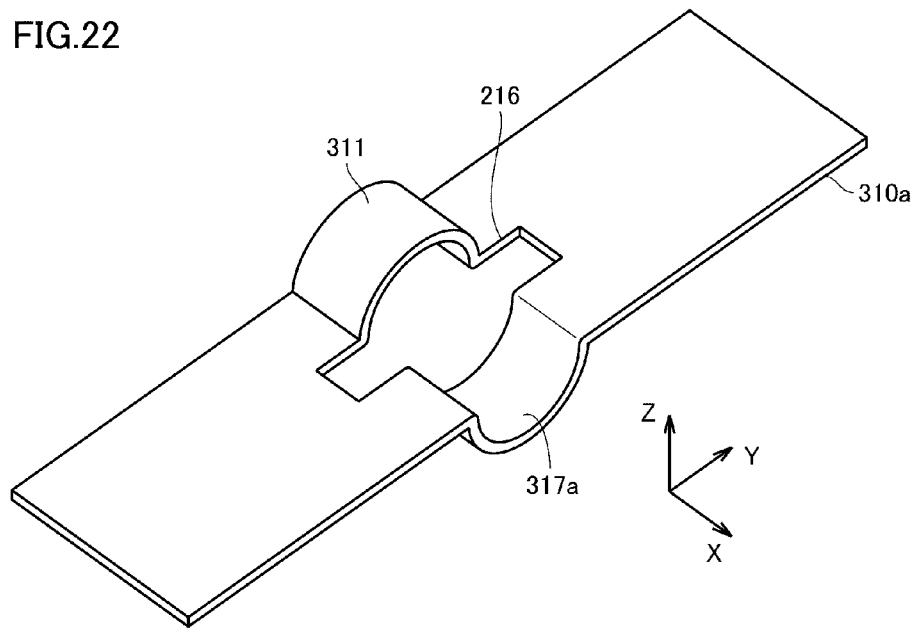
FIG. 22 is a perspective view illustrating an outward appearance of a primary conductor provided in a current sensor according to a modification of the third preferred embodiment of the present invention.

The shape of the arch-shaped portion 211 and the inverse-arch-shaped portion 317 is not limited to the above shape. FIG. 22 is a perspective view illustrating an outward appearance of a primary conductor provided in a current sensor according to a modification of the third preferred embodiment of the present invention. As illustrated in FIG. 22, a primary conductor 310a provided in the current sensor according to the modification of this preferred embodiment includes an arch-shaped portion 311 and an inverse-arch-shaped portion 317a each having a semicircular shape, when viewed from the width direction (X-axis direction) of the primary conductor 310a. In the current sensor according to the modification of this preferred embodiment, a housing of a magnetic sensor unit has a substantially columnar outer shape.

In the above description of the preferred embodiments, combinable structures may be mutually combined. For example, the magnetic sensor unit 360 may be inserted in the arch-shaped portion 211 in the current sensors 100 and 200 of the first and second preferred embodiments. In this case, the housing 350 is in contact with at least a portion of the inner surface of the arch-shaped portion 211. For example, the upper housing portion 352 is in contact with at least a portion of the back surface of the extending portion 214. The lower housing portion 351 is in contact with at least a portion of the front surface of the flat portion 215. In the current sensor, the housing may be provided integrally with the primary conductor or may be removably attached to the primary conductor.

Fourth Preferred Embodiment

A current sensor according to a fourth preferred embodiment of the present invention will be described below. A current sensor 400 according to the fourth preferred embodiment is mainly different from the current sensor 300 of the third preferred embodiment in the shapes of a first flow portion and a second flow portion. Hence, structures similar to those of the current sensor 300 of the third preferred embodiment are denoted by the same reference signs, and descriptions thereof are not repeated.

Figure 23:
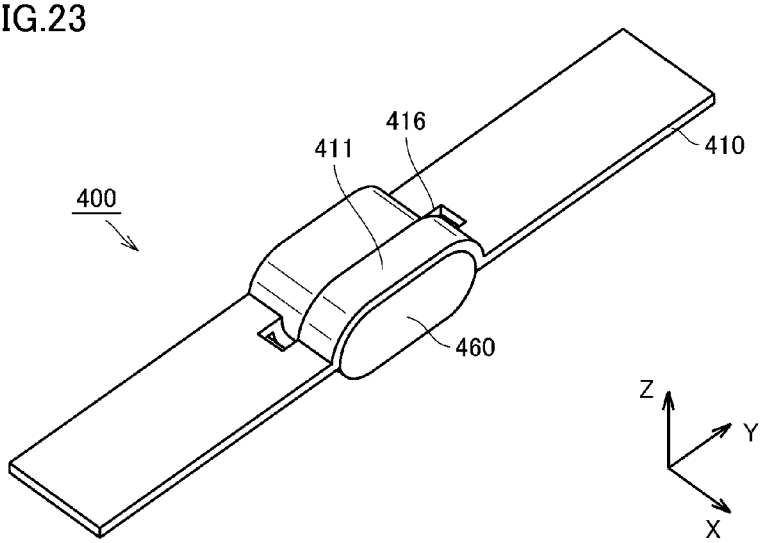
FIG. 23 is a perspective view illustrating an outward appearance of a current sensor according to a fourth preferred embodiment of the present invention.
Figure 24:
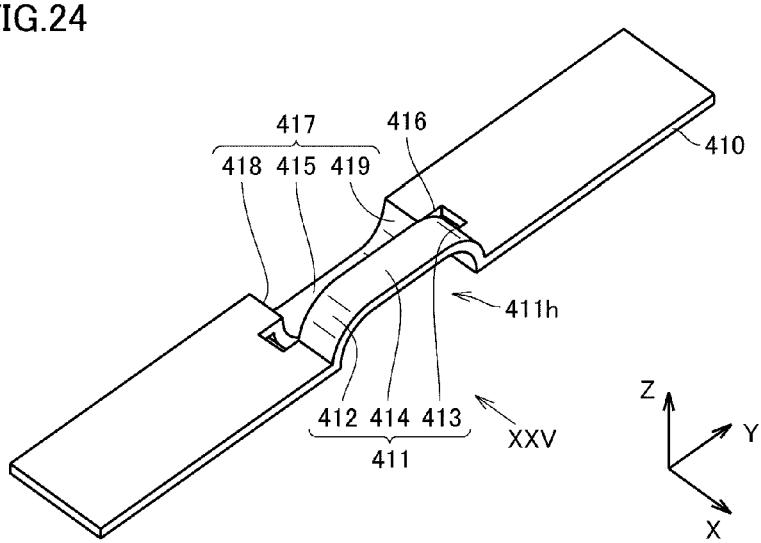
FIG. 24 is a perspective view illustrating an outward appearance of a primary conductor provided in the current sensor according to the fourth preferred embodiment of the present invention.
Figure 25:
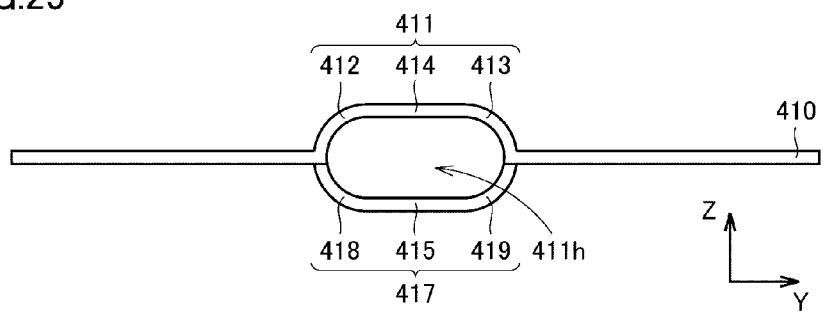
FIG. 25 is a side view of the primary conductor of FIG. 24, when viewed from a direction of arrow XXV.

FIG. 23 is a perspective view illustrating an outward appearance of the current sensor according to the fourth preferred embodiment of the present invention. FIG. 24 is a perspective view illustrating an outward appearance of a primary conductor provided in the current sensor according to the fourth preferred embodiment of the present invention. FIG. 25 is a side view of the primary conductor of FIG. 24, when viewed from a direction of arrow XXV.

As illustrated in FIGS. 23 to 25, the current sensor 400 according to the fourth preferred embodiment of the present invention includes a plate-shaped primary conductor 410 through which a current to be measured flows, which includes a front surface and a back surface, and which has a length direction (Y-axis direction), a width direction (X-axis direction) perpendicular or substantially perpendicular to the length direction (Y-axis direction), and a thickness direction (Z-axis direction) perpendicular or substantially perpendicular to the length direction (Y-axis direction) and the width direction (X-axis direction).

In this preferred embodiment, a first flow portion 411 bulges out toward a front surface of the primary conductor 410, when viewed from the width direction (X-axis direction). A second flow portion 417 bulges out toward a back surface of the primary conductor 410, when viewed from the width direction (X-axis direction). The second flow portion 417 is disposed beside the first flow portion 411 in the width direction (X-axis direction) of the primary conductor 410. When viewed from the width direction (X-axis direction), a region 411h is provided to be surrounded by the first flow portion 411 and the second flow portion 417. A slit 416 is located in a center portion of the primary conductor 410 in the width direction (X-axis direction) of the primary conductor 410.

The first flow portion 411 and the second flow portion 417 are each preferably semi-elliptic, when viewed from the width direction (X-axis direction) of the primary conductor 410, for example. The first flow portion 411 includes a first projecting portion 412 and a second projecting portion 413 projecting with a space therebetween in an arc form from the front surface of the primary conductor 410 and an extending portion 414 extending in the length direction (Y-axis direction) of the primary conductor 410 to connect the first projecting portion 412 and the second projecting portion 413. The second flow portion 417 includes a third projecting portion 418 and a fourth projecting portion 419 projecting with a space therebetween in an arc form from the back surface of the primary conductor 410 and an extending portion 415 extending in the length direction (Y-axis direction) of the primary conductor 410 to connect the third projecting portion 418 and the fourth projecting portion 419.

A magnetic sensor unit 460 is inserted in a space defined by the first flow portion 411 and the second flow portion 417. Thus, a first magnetic sensor element 120a is located inside the region 411h, when viewed from the width direction (X-axis direction), and a portion of the first magnetic sensor element 120a overlaps with the first flow portion 411, when viewed from the thickness direction (Z-axis direction) of the primary conductor 410. A second magnetic sensor element 120b is located inside the region 411h, when viewed from the width direction (X-axis direction), and a portion of the second magnetic sensor element 120b overlaps with the second flow portion 417, when viewed from the thickness direction (Z-axis direction) of the primary conductor 410.

In the current sensor 400 of this preferred embodiment, the sensitivity of the current sensor 400 is able to be increased and the influence of an external magnetic field is able to be reduced by increasing the sensitivities of the first magnetic sensor element 120a and the second magnetic sensor element 120b to the measured current flowing through the primary conductor 410.

Since the electric resistance of the first flow portion 411 and the electric resistance of the second flow portion 417 are substantially equal in the current sensor 400 of this preferred embodiment, the heating amount of the first flow portion 411 and the heating amount of the second flow portion 417 due to the measured current flowing through the primary conductor 410 are able to be made equal. As a result, the temperature around a magneto resistance element of the first magnetic sensor element 120a and the temperature around a magneto resistance element of the second magnetic sensor element 120b are made equal or substantially equal. Hence, it is possible to reduce the error of the measurement value of the current sensor 400 due to the temperature characteristics of the magneto resistance elements.

Figure 26:
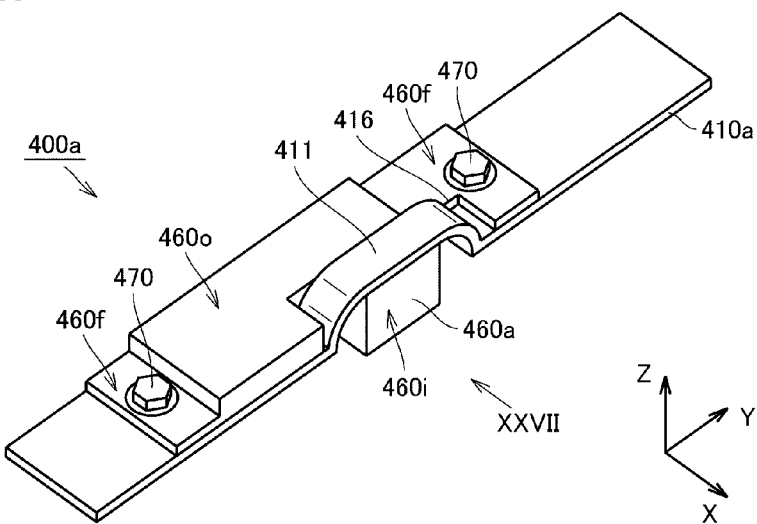
FIG. 26 is a perspective view illustrating an outward appearance of a current sensor according to a modification of the fourth preferred embodiment of the present invention.
Figure 27:
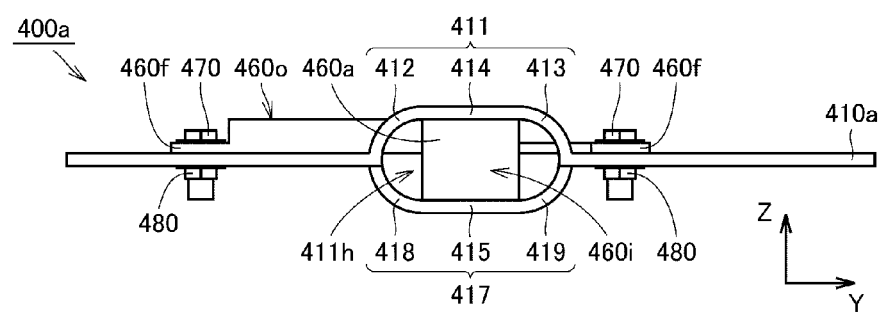
FIG. 27 is a side view of the current sensor of FIG. 26, when viewed from a direction of arrow XXVII.
Figure 28:
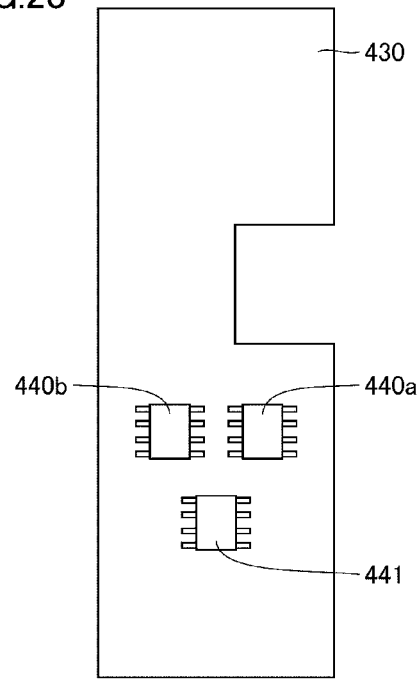
FIG. 28 illustrates a substrate of a magnetic sensor unit provided in the current sensor according to the modification of the fourth preferred embodiment of the present invention, when viewed from a front side.
Figure 29:
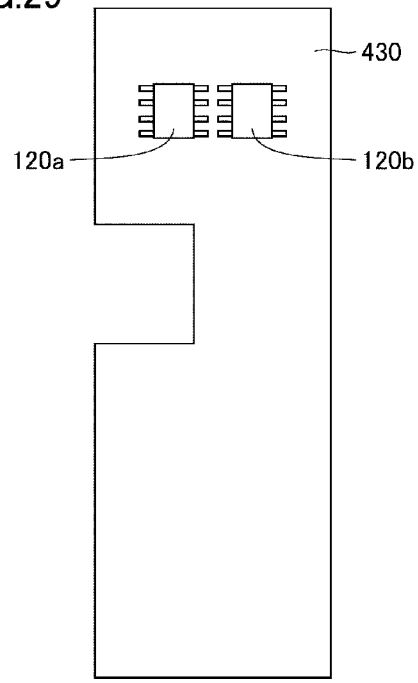
FIG. 29 illustrates the substrate of the magnetic sensor unit provided in the current sensor according to the modification of the fourth preferred embodiment of the present invention, when viewed from a back side.

A portion of the magnetic sensor unit 460 may be disposed outside the space defined by the first flow portion 411 and the second flow portion 417. FIG. 26 is a perspective view illustrating an outward appearance of a current sensor according to a modification of the fourth preferred embodiment of the present invention. FIG. 27 is a side view of the current sensor of FIG. 26, when viewed from a direction of arrow XXVII. FIG. 28 illustrates a substrate of a magnetic sensor unit provided in the current sensor according to the modification of the fourth preferred embodiment of the present invention, when viewed from a front side. FIG. 29 illustrates the substrate of the magnetic sensor unit provided in the current sensor according to the modification of the fourth preferred embodiment of the present invention, when viewed from a back side.

As illustrated in FIGS. 26 and 27, a current sensor 400a according the modification of the fourth preferred embodiment of the present invention includes a primary conductor 410a and a magnetic sensor unit 460a. The magnetic sensor unit 460a includes a magnetic-sensor storage portion 460i located inside a region 411h, an electronic-component storage portion 460o located outside the region 411h, and a flange portion 460f, when viewed from the width direction (X-axis direction). As illustrated in FIGS. 28 and 29, electronic components 440a, 440b, and 441 are mounted on a front surface of a portion of a substrate 430 located inside the electronic-component storage portion 460o. The electronic components 440a, 440b, and 441 define an arithmetic circuit. A first magnetic sensor element 120a and a second magnetic sensor element 120b are mounted on a back surface of a portion of the substrate 430 located inside the magnetic-sensor storage portion 460i.

The flange portion 460f has unillustrated through holes. The primary conductor 410a has unillustrated through holes at positions corresponding to the through holes of the flange portion 460f. By screwing bolts 470 inserted through the through holes of the flange portion 460f and the through holes of the primary conductor 410a into nuts 480, the magnetic sensor unit 460a and the primacy conductor 410 are fastened together. The bolts 470 and the nuts 480 are each made of a nonmagnetic material.

In the current sensor 400a according to the modification of the fourth preferred embodiment of the present invention, the magnetic sensor unit 460a is able to be reliably attached to the primary conductor 410a by the bolts 470 and the nuts 480. Also, the region 411h is made small by disposing the electronic components 440a, 440b, and 441, which define the arithmetic circuit, outside the region 411h. When the region 411h is made small, the distance between a first flow portion 411 and the first magnetic sensor element 120a and the distance between a second flow portion 417 and the second magnetic sensor element 120b are able to be decreased. Hence, the sensitivities of the first magnetic sensor element 120a and the second magnetic sensor element 120b are able to be increased. As a result, it is possible to reduce the influence of an external magnetic field while increasing the sensitivity of the current sensor 400a.

Fifth Preferred Embodiment

A current sensor according to a fifth preferred embodiment of the present invention will be described below. A current sensor 500 according to the fifth preferred embodiment is mainly different from the current sensor 300 of the third preferred embodiment in the shape of a first flow portion and a second flow portion. Hence, structures similar to those of the current sensor 300 of the third preferred embodiment are denoted by the same reference signs, and descriptions thereof are not repeated.

Figure 30:
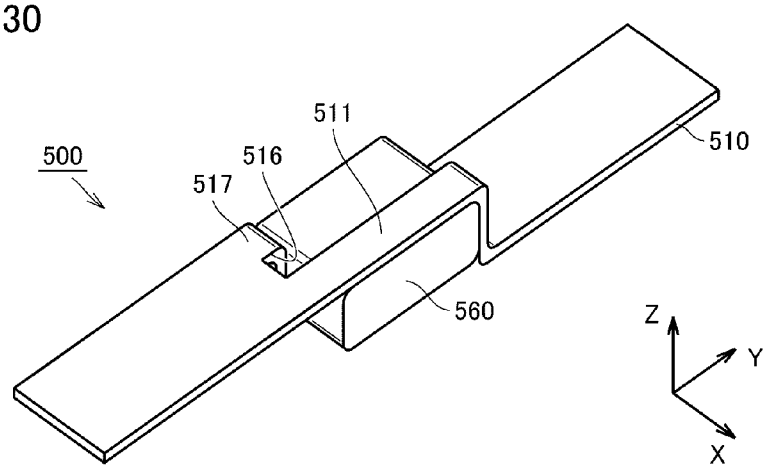
FIG. 30 is a perspective view illustrating an outward appearance of a current sensor according to a fifth preferred embodiment of the present invention.
Figure 31:
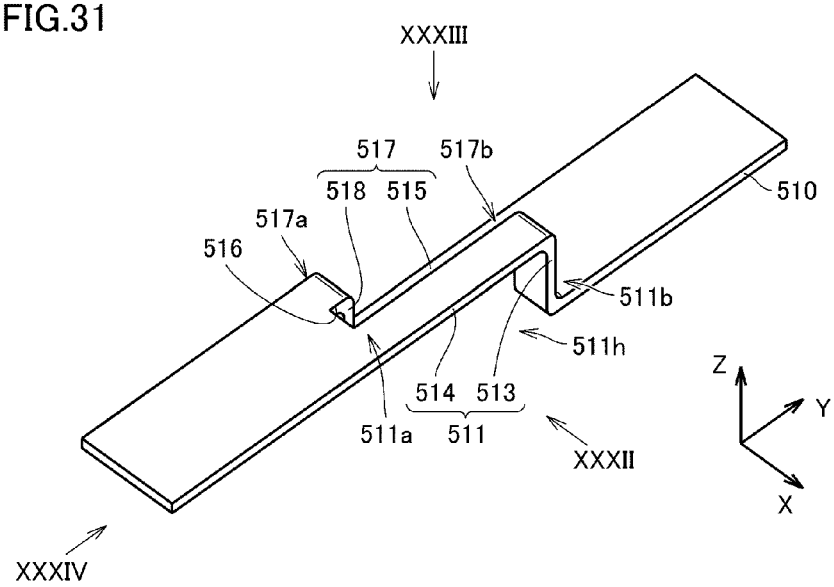
FIG. 31 is a perspective view illustrating an outward appearance of a primary conductor provided in the current sensor according to the fifth preferred embodiment of the present invention.
Figure 32:
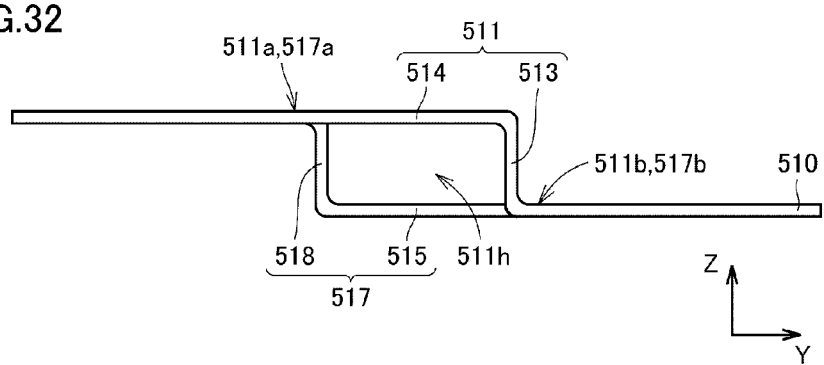
FIG. 32 is a side view of the primary conductor of FIG. 31, when viewed from a direction of arrow XXXII.
Figure 33:
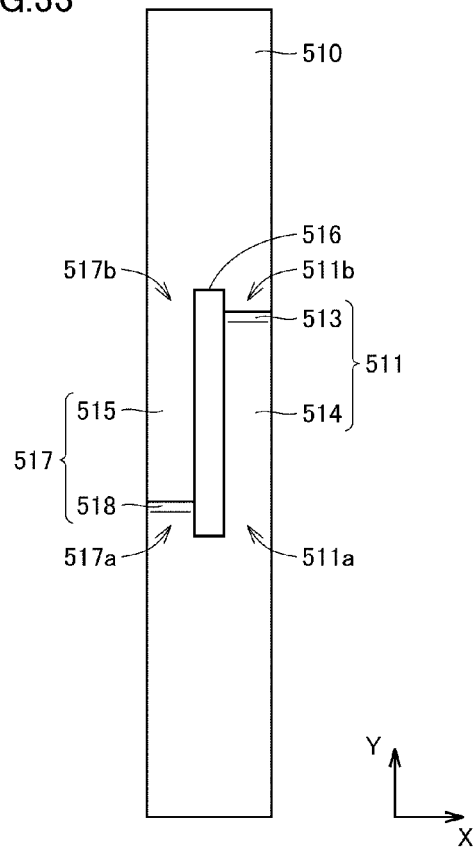
FIG. 33 is a top view of the primary conductor of FIG. 31, when viewed from a direction of arrow XXXIII.
Figure 34:
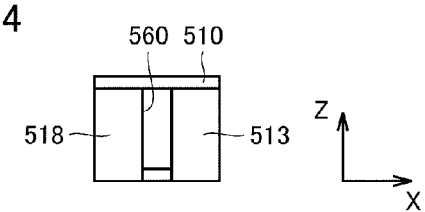
FIG. 34 is a front view of the primary conductor of FIG. 31, when viewed from a direction of arrow XXXIV.

FIG. 30 is a perspective view illustrating an outward appearance of the current sensor according to the fifth preferred embodiment of the present invention. FIG. 31 is a perspective view illustrating an outward appearance of a primary conductor provided in the current sensor according to the fifth preferred embodiment of the present invention. FIG. 32 is a side view of the primary conductor of FIG. 31, when viewed from a direction of arrow XXXII. FIG. 33 is a top view of the primary conductor of FIG. 31, when viewed from a direction of arrow XXXIII. FIG. 34 is a front view of the primary conductor of FIG. 31, when viewed from a direction of arrow XXXIV.

As illustrated in FIGS. 30 to 34, the current sensor 500 according to the fifth preferred embodiment of the present invention includes a plate-shaped primary conductor 510 through which a current to be measured flows, which includes a front surface and a back surface, and which has a length direction (Y-axis direction), a width direction (X-axis direction) perpendicular or substantially perpendicular to the length direction (Y-axis direction), and a thickness direction (Z-axis direction) perpendicular or substantially perpendicular to the length direction (Y-axis direction) and the width direction (X-axis direction).

In this preferred embodiment, a second flow portion 517 is disposed beside a first flow portion 511 in the width direction (X-axis direction) of the primary conductor 510. When viewed from the width direction (X-axis direction), a region 511h is surrounded by the first flow portion 511 and the second flow portion 517. A slit 516 is located in a center portion of the primary conductor 510 in the width direction (X-axis direction) of the primary conductor 510.

The first flow portion 511 includes the first end 511a and the second end 511b extending in the length direction (Y-axis direction). The second flow portion 517 includes the first end 517a and the second end 517b extending in the length direction (Y-axis direction). The first end 511a of the first flow portion 511 and the first end 517a of the second flow portion 517 are arranged in the width direction (X-axis direction) with the slit 516 being disposed therebetween. The second end 511b of the first flow portion 511 and the second end 517b of the second flow portion 517 are arranged in the width direction (X-axis direction) with the slit 516 being disposed therebetween.

The first end 511a of the first flow portion 511 and the second end 511b of the first flow portion 511 in the length direction (Y-axis direction) are different in the position in the thickness direction (Z-axis direction). The first end 517a of the second flow portion 517 and the second end 517b of the second flow portion 517 in the length direction (Y-axis direction) are different in the position in the thickness direction (Z-axis direction). The first end 511a of the first flow portion 511 and the first end 517a of the second flow portion 517 in the length direction (Y-axis direction) are equal in the position in the thickness direction (Z-axis direction). The second end 511b of the first flow portion 511 and the second end 517b of the second flow portion 517 in the length direction (Y-axis direction) are equal in the position in the thickness direction (Z-axis direction).

The first flow portion 511 includes a bent portion 513 that connects the position of the first end 511a of the first flow portion 511 and the position of the second end 511b of the first flow portion 511 in the thickness direction (Z-axis direction). The second flow portion 517 includes a bent portion 518 that connects the position of the first end 517a of the second flow portion 517 and the position of the second end 517b of the second flow portion 517 in the thickness direction (Z-axis direction). The bent portion 513 of the first flow portion 511 and the bent portion 518 of the second flow portion 517 are located with a space therebetween in the length direction (Y-axis direction).

In this preferred embodiment, the first flow portion 511 includes an extending portion 514 extending from the first end 511a in the length direction (Y-axis direction) and a bent portion 513 linearly extending in the thickness direction (Z-axis direction) from an end portion of the extending portion 514 in the length direction (Y-axis direction) toward the second end 511b. That is, the first flow portion 511 includes a stepped shape. The extending portion 514 is in contact with the first end 511a of the first flow portion 511. The bent portion 513 is in contact with the second end 511b of the first flow portion 511. The shape of the bent portion 513 is not limited to the above shape. The bent portion 513 may linearly extend in a direction intersecting the length direction (Y-axis direction) and the thickness direction (Z-axis direction) or may be curved, when viewed from the width direction (X-axis direction).

The second flow portion 517 includes a bent portion 518 linearly extending from the first end 517a in the thickness direction (Z-axis direction) and an extending portion 515 extending in the length direction (Y-axis direction) from an end portion of the bent portion 518 in the thickness direction (Z-axis direction) toward the second end 517b. That is, the second flow portion 517 includes a stepped shape. The extending portion 515 is in contact with the second end 517b of the second flow portion 517. The bent portion 518 is in contact with the first end 517a of the second flow portion 517. The shape of the bent portion 518 is not limited to the above shape. When viewed from the width direction (X-axis direction), the bent portion 518 may linearly extend in a direction intersecting the length direction (Y-axis direction) and the thickness direction (Z-axis direction), or may be curved.

A magnetic sensor unit 560 is inserted in a space defined by the first flow portion 511 and the second flow portion 517. Thus, a first magnetic sensor element 120a is located inside the region 511h, when viewed from the width direction (X-axis direction), and a portion of the first magnetic sensor element 120a overlaps with the first flow portion 511, when viewed from the thickness direction (Z-axis direction) of the primary conductor 510. A second magnetic sensor element 120b is located inside the region 511h, when viewed from the width direction (X-axis direction), and a portion of the second magnetic sensor element 120b overlaps with the second flow portion 517, when viewed from the thickness direction (Z-axis direction) of the primary conductor 510.

In the current sensor 500 according to this preferred embodiment, the sensitivity of the current sensor 500 is able to be increased and the influence of an external magnetic field is able to be reduced by increasing the sensitivities of the first magnetic sensor element 120a and the second magnetic sensor element 120b to the measured current flowing through the primary conductor 510.

In the current sensor 500 of this preferred embodiment, since the electric resistance of the first flow portion 511 is equal or substantially equal to the electric resistance of the second flow portion 517, the heating amount of the first flow portion 511 and the heating amount of the second flow portion 517 due to the flow of the measured current through the primary conductor 510 are able to be made equal. As a result, the temperature around a magneto resistance element of the first magnetic sensor element 120a and the temperature around a magneto resistance element of the second magnetic sensor element 120b are able to be made equal or substantially equal. Hence, it is possible to reduce or prevent the error of the measurement value of the current sensor 500 due to the temperature characteristics of the magneto resistance elements.

Figure 35:
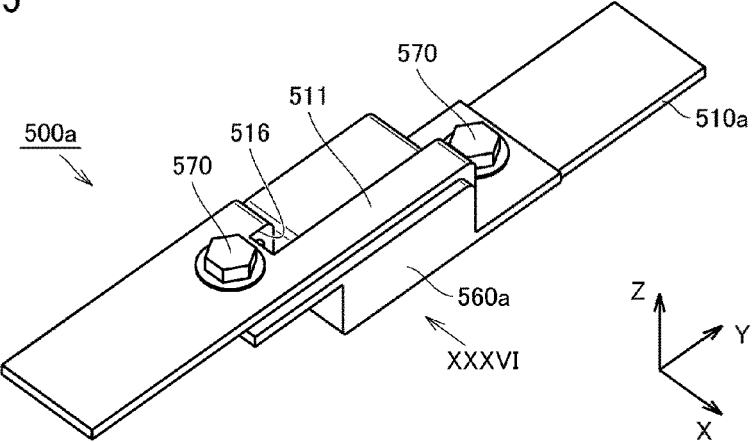
FIG. 35 is a perspective view illustrating an outward appearance of a current sensor according to a modification of the fifth preferred embodiment of the present invention.
Figure 36:
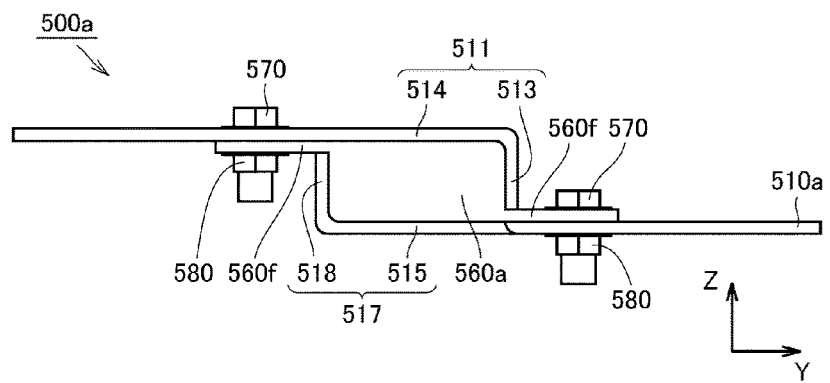
FIG. 36 is a side view of the current sensor of FIG. 35, when viewed from a direction of arrow XXXVI.

A housing of the magnetic sensor unit 560 may be provided with a flange that fixes the conductor. FIG. 35 is a perspective view illustrating an outward appearance of a current sensor according to a modification of the fifth preferred embodiment of the present invention. FIG. 36 is a side view of the current sensor of FIG. 35, when viewed from a direction of arrow XXXVI.

As illustrated in FIGS. 35 and 36, a current sensor 500a according to the modification of the fifth preferred embodiment of the present invention includes a primary conductor 510a and a magnetic sensor unit 560a. A housing of the magnetic sensor unit 560a is provided with flange portions 560f. The flange portions 560f include unillustrated through holes. The primary conductor 510a includes unillustrated through holes at positions corresponding to the through holes of the flange portions 560f. The magnetic sensor unit 560a and the primary conductor 510a are able to be fastened by screwing bolts 570 inserted through the through holes of the flange portions 560f and the through holes of the primary conductor 510a into nuts 580. The bolts 570 and the nuts 580 are each made of a nonmagnetic material.

In the current sensor 500a according to the modification of the fifth preferred embodiment of the present invention, the magnetic sensor unit 560a is able to be reliably attached to the primary conductor 510a by the bolts 570 and the nuts 580.

Sixth Preferred Embodiment

A current sensor according to a sixth preferred embodiment of the present invention will be described below. A current sensor 600 according to the sixth preferred embodiment is mainly different from the current sensor 100 of the first preferred embodiment in that a first magnetic sensor element and a second magnetic sensor element are arranged in the thickness direction (Z-axis direction) of a primary conductor. Hence, structures similar to those of the current sensor 100 of the first preferred embodiment are denoted by the same reference signs, and descriptions thereof are not repeated.

Figure 37:
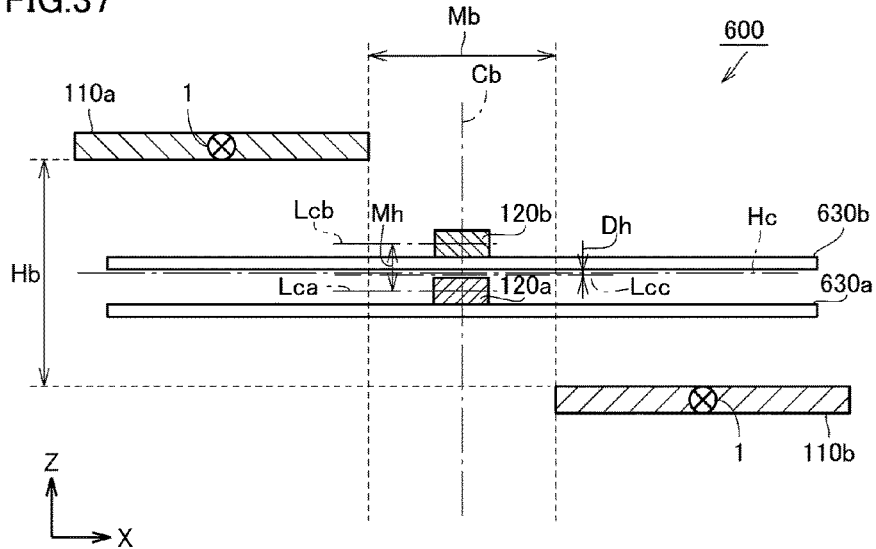
FIG. 37 is a cross-sectional view illustrating a structure of a current sensor according to a sixth preferred embodiment of the present invention.
Figure 38:
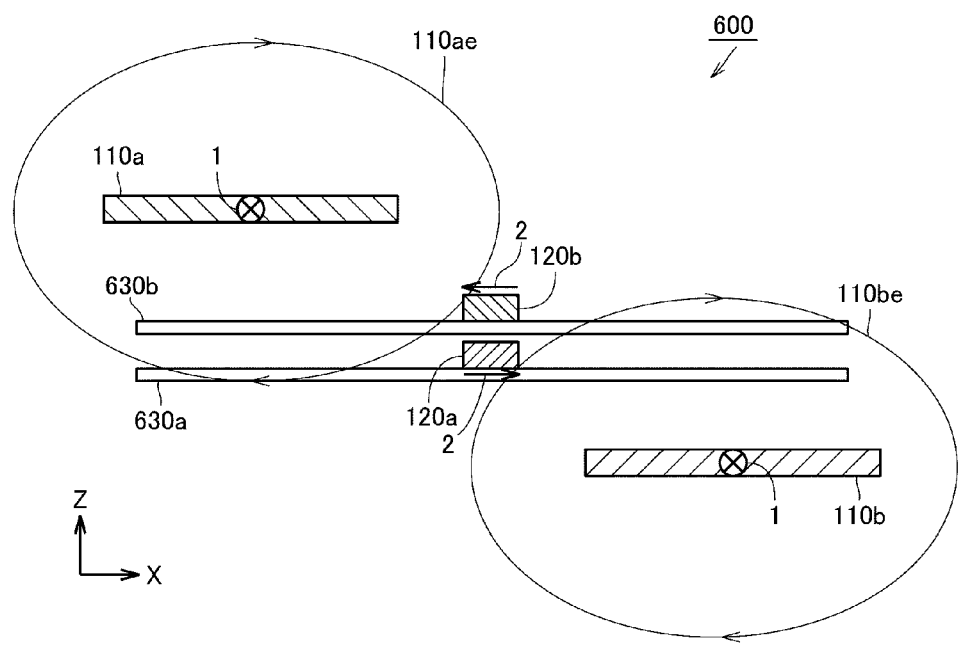
FIG. 38 is a cross-sectional view schematically illustrating magnetic fields generated when a current to be measured flows through a primary conductor in the current sensor according to the sixth preferred embodiment of the present invention.

FIG. 37 is a cross-sectional view illustrating a structure of the current sensor according to the sixth preferred embodiment of the present invention. FIG. 38 is a cross-sectional view schematically illustrating magnetic fields generated when a current to be measured flows through a primary conductor in the current sensor according to the sixth preferred embodiment of the present invention. FIGS. 37 and 38 show cross sections similar to that of FIG. 2.

As illustrated in FIGS. 37 and 38, in the current sensor 600 according to the sixth preferred embodiment of the present invention, a first magnetic sensor element 120a and a second magnetic sensor element 120b are arranged in the thickness direction (Z-axis direction) of a primary conductor 610. The first magnetic sensor element 120a and the second magnetic sensor element 120b are mounted on different substrates. Specifically, the first magnetic sensor element 120a is mounted on a first substrate 630a. The second magnetic sensor element 120b is mounted on a second substrate 630b.

The first substrate 630a on which the first magnetic sensor element 120a is mounted is inserted between a first conductor 110a and a second conductor 110b. The second substrate 630b on which the second magnetic sensor element 120b is mounted is inserted between the first conductor 110a and the second conductor 110b. In this preferred embodiment, the first substrate 630a is located parallel or substantially parallel to each of the first conductor 110a and the second conductor 110b with a space therebetween. The second substrate 630b is located parallel or substantially parallel to each of the first conductor 110a and the second conductor 110b with a space therebetween. The first substrate 630a and the second substrate 630b are located parallel or substantially parallel to each other with a space therebetween. However, the first magnetic sensor element 120a and the second magnetic sensor element 120b may be mounted on a single substrate located perpendicularly or substantially perpendicularly to each of the first conductor 110a and the second conductor 110b.

In FIG. 37, in the width direction (X-axis direction) of the primary conductor 110, a center line passing through the center of the first magnetic sensor element 120a is represented by Lca, a center line passing through the center of the second magnetic sensor element 120b is represented by Lcb, and a center line between the center line Lca and the center line Lcb is represented by Lcc. The center line Lca passes through the center of a magneto resistance film that defines the first magnetic sensor element 120a. The center line Lcb passes through the center of a magneto resistance film that defines the second magnetic sensor element 120b. The distance (sensor distance) between the center line Lca and the center line Lcb in the thickness direction (Z-axis direction) of the primary conductor 610 is represented by Mh.

In the width direction (X-axis direction) of the primary conductor 110, a center line passing through the middle portion between the first conductor 110a and the second conductor 110b is represented by Hc. The distance (displacement amount) between the center line Hc and the center line Lcc in the thickness direction (Z-axis direction) of the primary conductor 610 is represented by Dh.

In this preferred embodiment, as illustrated in FIG. 38, the direction of a detection axis 2 of the first magnetic sensor element 120a is opposite from the direction of a detection axis 2 of the second magnetic sensor element 120b. The first magnetic sensor element 120a is located at a position where a magnetic field component of a measured magnetic field directed toward one side in the width direction (X-axis direction) of the primary conductor 110 is applied. Specifically, the first magnetic sensor element 120a is located at a position where a magnetic field component directed in the arrow direction of the detection axis 2 is applied.

The second magnetic sensor element 120b is located at a position where a magnetic field component of the measured magnetic field directed toward the other side in the width direction (X-axis direction) of the primary conductor 110 is applied. Specifically, the second magnetic sensor element 120b is located at a position where a magnetic field component directed in the arrow direction of the detection axis 2 is applied.

In this case, when the intensity of an external magnetic field to be detected by the first magnetic sensor element 120a has a positive value, the intensity of the external magnetic field to be detected by the second magnetic sensor element 120b has a negative value. On the other hand, the phase of the detection value of the first magnetic sensor element 120a and the phase of the detection value of the second magnetic sensor element 120b for the intensity of the magnetic field generated by the measured current flowing through the primary conductor 110 are the same.

In this preferred embodiment, an adder or a summing amplifier is used as a calculator 190 instead of the differential amplifier. Regarding the intensity of the external magnetic field, the detection value of the first magnetic sensor element 120a and the detection value of the second magnetic sensor element 120b are added by the adder or the summing amplifier, so that the absolute value of the detection value of the first magnetic sensor element 120a and the absolute value of the detection value of the second magnetic sensor element 120b are subtracted. Thus, the magnetic field from an external magnetic-field source is hardly detected. That is, the influence of the external magnetic field is reduced.

On the other hand, regarding the intensity of the magnetic field generated by the current flowing through the primary conductor 110, the detection value of the first magnetic sensor element 120a and the detection value of the second magnetic sensor element 120b are added by the adder or the summing amplifier, so that the value of the measured current flowing through the primary conductor 110 is calculated.

In this way, the adder or the summing amplifier may be used as the calculator instead of the differential amplifier while the input/output characteristics of the first magnetic sensor element 120a and the input/output characteristics of the second magnetic sensor element 120b are opposite in polarity.

As illustrated in FIGS. 5 and 6, the change rate of the magnetic flux density of the measured magnetic field in the width direction (X-axis direction) of the primary conductor 110 according to the position in the thickness direction (Z-axis direction) of the primary conductor 110 is small in the robust region T in the width direction (X-axis direction) of the primary conductor 110. For this reason, when the positions of the first magnetic sensor element 120a and the second magnetic sensor element 120b in the width direction (X-axis direction) of the primary conductor 110 are inside the robust region T and the positions of the first magnetic sensor element 120a and the second magnetic sensor element 120b in the thickness direction (Z-axis direction) of the primary conductor 110 are both displaced, the detection value of the first magnetic sensor element 120a and the detection value of the second magnetic sensor element 120b hardly change. That is, the sum of the detection value of the first magnetic sensor element 120a and the detection value of the second magnetic sensor element 120b hardly changes.

As a result, it is possible to reduce the measurement error of the current sensor 600 resulting from the displacement of the first magnetic sensor element 120a and the second magnetic sensor element 120b relative to the primary conductor 110 through which the current to be measured flows.

In this preferred embodiment, since the first magnetic sensor element 120a and the second magnetic sensor element 120b are mounted on different substrates, stress caused by deflection of the substrates is reduced. Hence, the first magnetic sensor element 120a and the second magnetic sensor element 120b are prevented from being damaged by the stress caused by deflection of the substrates.

In the above descriptions of the preferred embodiments, combinable structures may be mutually combined. For example, the inverse-arch-shaped portion 317 may be provided in the primary conductor 110 instead of the flat portion 115 in the current sensor 100 of the first preferred embodiment. The magnetic sensor unit 360 may be inserted in the arch-shaped portion 111 in the current sensors 100 and 200 of the first and second preferred embodiments. In this case, the housing 350 is in contact with at least a portion of the inner surface of the arch-shaped portion 111. For example, the upper housing portion 352 is in contact with at least a portion of the back surface of the extending portion 114. The lower housing portion 351 is in contact with at least a portion of the front surface of the flat portion 115. In the current sensor, the housing may be provided integrally with the primary conductor, or may be detachably attached to the primary conductor.

In the above descriptions of the preferred embodiments, combinable structures may be mutually combined.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A current sensor comprising:
a plate-shaped conductor through which a current to be measured flows, the conductor including a front surface and a back surface, a length direction, a width direction perpendicular or substantially perpendicular to the length direction, and a thickness direction perpendicular or substantially perpendicular to the length direction and the width direction; and
a first magnetic sensor element and a second magnetic sensor element that detect an intensity of a magnetic field generated by the current; wherein
the conductor includes a first flow portion and a second flow portion through which the current flows after the current is shunted midway in the length direction;
the first flow portion and the second flow portion are located with a space therebetween in the width direction and the thickness direction;
the first magnetic sensor element and the second magnetic sensor element are provided between the first flow portion and the second flow portion in the thickness direction;
at least a portion of each of the first magnetic sensor element and the second magnetic sensor element is provided between the first flow portion and the second flow portion in the width direction;
in the width direction, a distance between a center portion of the first magnetic sensor element and a center portion of the second magnetic sensor element is less than or equal to a distance between the first flow portion and the second flow portion;

the first magnetic sensor element and the second magnetic sensor element are mounted on or in at least one substrate, a housing, a magnetic sensor unit or at least one package; and in the thickness direction, at least a portion of one of the at least one substrate, the housing, the magnetic sensor unit, and at least one package overlaps the plate-shaped conductor.

2. The current sensor according to claim 1, wherein the first magnetic sensor element and the second magnetic sensor element are arranged in the width direction.

3. The current sensor according to claim 2, wherein each of the center portion of the first magnetic sensor element and the center portion of the second magnetic sensor element is located between the first flow portion and the second flow portion in the width direction.

4. The current sensor according to claim 2, wherein each of the first magnetic sensor element and the second magnetic sensor element is entirely located between the first flow portion and the second flow portion in the width direction.

5. The current sensor according to claim 3, wherein
a portion of the first magnetic sensor element overlaps with a portion of the conductor that defines the first flow portion, when viewed from the thickness direction; and
a portion of the second magnetic sensor element overlaps with a portion of the conductor that defines the second flow portion, when viewed from the thickness direction.

6. The current sensor according to claim 1, wherein the conductor includes an arch-shaped portion bending and projecting toward a first side in the thickness direction and extending in the length direction to define the first flow portion.

7. The current sensor according to claim 6, wherein the conductor further includes an inverse-arch-shaped portion bending and projecting toward a second side in the thickness direction and extending in the length direction to define the second flow portion.

8. The current sensor according to claim 7, wherein
a portion of the first magnetic sensor element is disposed inside the arch-shaped portion to be located on a side of the back surface of the conductor; and
a portion of the second magnetic sensor element is disposed inside the inverse-arch-shaped portion to be located on a side of the front surface of the conductor.

9. The current sensor according to claim 7, wherein the arch-shaped portion and the inverse-arch-shaped portion have a same shape or substantially a same shape.

10. The current sensor according to claim 1, wherein the first flow portion bulges out from the front surface of the conductor, when viewed from the width direction.

11. The current sensor according to claim 10, wherein the second flow portion bulges out from the back surface of the conductor, when viewed from the width direction.

12. The current sensor according to claim 11, wherein shapes of the first flow portion and the second flow portion are point-symmetrical with respect to each other.

13. The current sensor according to claim 11, further comprising:
a housing that stores the first magnetic sensor element and the second magnetic sensor element; wherein
the housing is in contact with at least a portion of a back surface of the first flow portion and at least a portion of a front surface of the second flow portion.

14. The current sensor according to claim 13, wherein
each of the first flow portion and the second flow portion includes an extending portion extending in the length direction; and
the housing is in contact with at least a portion of a back surface of the extending portion of the first flow portion and at least a portion of a front surface of the extending portion of the second flow portion.

15. The current sensor according to claim 1, wherein
each of the first flow portion and the second flow portion includes a first end and a second end extending in the length direction;
the first end of the first flow portion and the second end of the first flow portion in the length direction are located at different positions in the thickness direction;
the first end of the second flow portion and the second end of the second flow portion in the length direction are located at different positions in the thickness direction;
the first end of the first flow portion and the first end of the second flow portion in the length direction are located at a same position in the thickness direction;
the second end of the first flow portion and the second end of the second flow portion in the length direction are located at a same position in the thickness direction;
the first flow portion includes a bent portion that connects a position of the first end of the first flow portion and a position of the second end of the first flow portion in the thickness direction;
the second flow portion includes a bent portion that connects a position of the first end of the second flow portion and a position of the second end of the second flow portion in the thickness direction; and
the bent portion of the first flow portion and the bent portion of the second flow portion are located with a space therebetween in the length direction.

16. The current sensor according to claim 1, wherein the conductor includes a slit extending in the length direction so that the first flow portion and the second flow portion are located with a space therebetween in the width direction.

17. The current sensor according to claim 16, wherein the slit is located in a center portion of the conductor in the width direction.

18. The current sensor according to claim 16, wherein a center portion of the slit is located in a middle portion between the first magnetic sensor element and the second magnetic sensor element in the width direction, when viewed from the thickness direction.

19. The current sensor according to claim 1, wherein the conductor is defined by a single conductor.

20. The current sensor according to claim 17, wherein each of the first magnetic sensor element and the second magnetic sensor element is located in a middle portion between the first flow portion and the second flow portion in the thickness direction.

21. The current sensor according to claim 1, wherein the first magnetic sensor element and the second magnetic sensor element are arranged in the thickness direction.

22. The current sensor according to claim 1, wherein
each of the first magnetic sensor element and the second magnetic sensor element detects a magnetic field component in the width direction;

the first magnetic sensor element is disposed at a position where a magnetic field component of the magnetic field directed toward one side in the width direction is applied; and the second magnetic sensor element is disposed at a position where a magnetic field component of the magnetic field directed toward the other side in the width direction is applied.

23. The current sensor according to claim 1, wherein the first magnetic sensor element and the second magnetic sensor element are mounted on a single substrate.

24. The current sensor according to claim 1, wherein the first magnetic sensor element and the second magnetic sensor element are mounted on different substrates.

25. The current sensor according to claim 1, further comprising:

a housing that stores the first magnetic sensor element and the second magnetic sensor element; wherein the housing is in contact with at least a portion of a back surface of the first flow portion.

26. The current sensor according to claim 25, wherein the first flow portion includes an extending portion extending in the length direction; and the housing is in contact with at least a portion of a back surface of the extending portion.

27. The current sensor according to claim 1, further comprising:

a calculator that calculates a value of the current by computing a detection value of the first magnetic sensor element and a detection value of the second magnetic sensor element; wherein a phase of the detection value of the first magnetic sensor element and a phase of the detection value of the second magnetic sensor element for the intensity of the magnetic field generated by the current flowing through the conductor are opposite from each other; and the calculator is a subtractor or a differential amplifier.

28. The current sensor according to claim 1, further comprising:

a calculator that calculates a value of the current by computing a detection value of the first magnetic sensor element and a detection value of the second magnetic sensor element; wherein a phase of the detection value of the first magnetic sensor element and a phase of the detection value of the second magnetic sensor element for the intensity of the magnetic field generated by the current flowing through the conductor are the same; and the calculator is an adder or a summing amplifier.

* * * * *